(12) United States Patent
Jo et al.

(10) Patent No.: US 12,408,542 B2
(45) Date of Patent: Sep. 2, 2025

(54) DISPLAY PANEL AND METHOD OF MANUFACTURING THE SAME

(71) Applicant: Samsung Display Co., Ltd., Yongin-si (KR)

(72) Inventors: Yongjun Jo, Yongin-si (KR); Kwangchul Jung, Yongin-si (KR); Mina Kim, Yongin-si (KR); Seulbee Lee, Yongin-si (KR)

(73) Assignee: Samsung Display Co., LTD., Gyeonggi-do (KR)

( * ) Notice: Subject to any disclaimer, the term of this patent is extended or adjusted under 35 U.S.C. 154(b) by 0 days.

(21) Appl. No.: 18/404,862

(22) Filed: Jan. 4, 2024

(65) Prior Publication Data
US 2024/0244942 A1    Jul. 18, 2024

Related U.S. Application Data

(62) Division of application No. 17/468,526, filed on Sep. 7, 2021, now Pat. No. 11,889,744.

(30) Foreign Application Priority Data

Oct. 20, 2020 (KR) .................. 10-2020-0135811

(51) Int. Cl.
| | |
|---|---|
| *H10K 71/20* | (2023.01) |
| *H10K 50/844* | (2023.01) |
| *H10K 59/12* | (2023.01) |
| *H10K 59/65* | (2023.01) |
| *H10K 59/80* | (2023.01) |

(Continued)

(52) U.S. Cl.
CPC ......... *H10K 71/221* (2023.02); *H10K 50/844* (2023.02); *H10K 59/12* (2023.02); *H10K 59/65* (2023.02); *H10K 59/80517* (2023.02); *H10K 71/00* (2023.02); *H10K 71/621* (2023.02);
(Continued)

(58) Field of Classification Search
None
See application file for complete search history.

(56) References Cited

U.S. PATENT DOCUMENTS

| | | | |
|---|---|---|---|
| 10,362,696 B2 | 7/2019 | Ahn | |
| 10,649,567 B2 * | 5/2020 | Kim | ..................... H10K 59/873 |

(Continued)

FOREIGN PATENT DOCUMENTS

| | | |
|---|---|---|
| CN | 110649180 | 1/2020 |
| KR | 10-2016-0057197 | 5/2016 |

(Continued)

OTHER PUBLICATIONS

Notice of Allowance issued Oct. 2, 2023, in U.S. Appl. No. 17/468,526.

*Primary Examiner* — Michelle Mandala
(74) *Attorney, Agent, or Firm* — HARNESS, DICKEY & PIERCE, P.L.C.

(57) ABSTRACT

A display panel includes a substrate including an opening and a display area surrounding the opening, a light-emitting element in the display area and including a first electrode, an intermediate layer, and a second electrode, a multi-layered dam in a non-display area between the opening and the display area, an encapsulation layer extending substantially over the display area and the non-display area, and a first layer pattern disposed in one area of the non-display area.

15 Claims, 21 Drawing Sheets

(51) Int. Cl.
 *H10K 71/00* (2023.01)
 *H10K 59/131* (2023.01)
(52) U.S. Cl.
 CPC ....... *H10K 59/1201* (2023.02); *H10K 59/131* (2023.02); *H10K 59/8731* (2023.02)

(56) References Cited

U.S. PATENT DOCUMENTS

| | | | |
|---|---|---|---|
| 10,840,317 | B2 | 11/2020 | Oh et al. |
| 2016/0285038 | A1* | 9/2016 | Kim .................... H10K 59/8731 |
| 2019/0074459 | A1 | 3/2019 | Kim et al. |
| 2020/0303677 | A1* | 9/2020 | Lee ...................... H10K 59/124 |
| 2020/0321292 | A1* | 10/2020 | Park ..................... H10K 59/131 |
| 2021/0026477 | A1* | 1/2021 | Lee ........................ G06F 3/0412 |
| 2021/0111231 | A1 | 4/2021 | Choi et al. |
| 2021/0265429 | A1* | 8/2021 | Yamanaka ............. H05B 33/02 |

FOREIGN PATENT DOCUMENTS

| | | |
|---|---|---|
| KR | 10-2017-0045459 | 4/2017 |
| KR | 10-2018-0114565 | 10/2018 |
| KR | 10-2020-0102580 | 9/2020 |

\* cited by examiner

DISPLAY PANEL AND METHOD OF MANUFACTURING THE SAME

CROSS-REFERENCE TO RELATED APPLICATION

This application is a Divisional of U.S. patent application Ser. No. 17/468,526, filed Sep. 7, 2021, which claims priority from and the benefit of Korean Patent Application No. 10-2020-0135811, filed on Oct. 20, 2020, each of which is hereby incorporated by reference for all purposes as if fully set forth herein.

BACKGROUND

Field

Embodiments of the invention relate generally to a display apparatus and, more specifically to a display panel having an opening formed in a display area of the display panel and a method of manufacturing the same.

Discussion of the Background

Generally, a display apparatus may be used in a mobile device, such as a smartphone, a laptop computer, a digital camera, a camcorder, a portable information terminal, a notebook, or a tablet personal computer, or in an electronic device such as a desktop computer, a television, an outdoor billboard, a display apparatus for exhibition, a dashboard for a vehicle, or a head-up display (HUD).

Recently, in a display apparatus, the trend in the industry is to increase the size of the display area that displays images. Various functions connected to a display apparatus have been added while the area occupied by a display area has increased. An opening may be formed in the display area to add various functions.

The above information disclosed in this Background section is only for understanding of the background of the inventive concepts, and, therefore, it may contain information that does not constitute prior art.

SUMMARY

Applicant discovered that during manufacturing of an opening in a display panel, particles may be generated when forming a non-display area around the opening area. The particles may cause a crack in an encapsulation layer, which may damage a light-emitting element surrounding the opening.

Display panels constructed according to the principles and embodiments of the invention and illustrative methods of manufacturing the same are capable of readily controlling particles that may be generated during the process of making a hole in the display panel. For example, a 2-step Laser Lift Off (LLO) method may be used to remove a sacrificial layer, an intermediate layer, and a second electrode, which are stacked in the non-display area around the opening without generating significant accumulation of harmful particles.

Additional features of the inventive concepts will be set forth in the description which follows, and in part will be apparent from the description, or may be learned by practice of the inventive concepts.

According to one aspect of the invention, a method of manufacturing a display panel having an opening, a display area surrounding the opening, and a non-display area between the opening and the display area, the method includes the steps of: forming a pixel circuit including a at least one thin-film transistor in the display area, forming a first electrode electrically connected to the at least one thin-film transistor, forming a first layer having a plurality of slits in the non-display area, forming, on the first electrode, an intermediate layer and a second electrode that form a light-emitting element, the intermediate layer and the second electrode being disposed on the display area and the non-display area, and covering the first layer, lifting the second electrode off from the intermediate layer by irradiating a first laser beam having a first energy density toward the first layer, the intermediate layer, and the second electrode, which are stacked, and lifting off the first layer and the intermediate layer by irradiating a second laser beam having a second energy density greater than the first energy density toward the first layer.

The first layer may include a sacrificial layer formed in the same process as that of the first electrode and including a same material as that of the first electrode.

The sacrificial layer may include a multi-layered structure of indium tin oxide (ITO)/silver (Ag)/ITO.

The plurality of slits may be formed over substantially an entire area of the first layer.

The plurality of slits may be formed in i) a discontinuous linear pattern or a discontinuous curved pattern or ii) a continuous linear pattern or a continuous curved pattern.

The second electrode may include a metal material including Ag.

In the step of irradiating the first laser beam, the first laser beam may pass through the plurality of slits formed in the first layer and then pass through the intermediate layer to be irradiated onto one surface of the second electrode.

The first energy density may be about 0.7 $J/cm^2$ or less.

In the step of irradiating the second laser beam, the second laser beam may be irradiated to one surface of the first layer in which the plurality of slits are formed.

The second energy density may be about 1.5 $J/cm^2$ or more.

The method may further include the step of forming a pattern in a portion of the first layer disposed in at least one non-display area around a start point or a finish point where the laser beam is irradiated.

The method may further include the step of forming a multi-layered dam in the non-display area in the same process as that of a plurality of insulating layers among insulating layers between each element of the thin-film transistor and the light-emitting element. A vicinity of the start point where the laser beam is irradiated may correspond to the non-display area adjacent to the dam, and the pattern in the first layer may be located in the non-display area adjacent to the dam.

A vicinity of the finish point where the laser beam is irradiated may correspond to the non-display area adjacent to the opening, and the pattern in the first layer may be located in the non-display area adjacent to the opening.

The method may further include the step of forming an encapsulation layer over the display area and the non-display area. At least one inorganic encapsulation layer in the encapsulation layer may extend to an area from which the first layer is lifted off to cover the pattern in the first layer.

According to another aspect of the invention, a display panel includes: a substrate including an opening and a display area surrounding the opening, a light-emitting element in the display area and including a first electrode, an intermediate layer, and a second electrode, a multi-layered dam in a non-display area between the opening and the display area, an encapsulation layer extending substantially over the display area and the non-display area, and a first layer pattern disposed in one area of the non-display area.

The first layer pattern may be disposed in at least one of the non-display area adjacent to the multi-layered dam or the non-display area adjacent to the opening.

The first layer pattern may be arranged in the one area of the non-display area in a discontinuous linear pattern or a discontinuous curved pattern.

The first layer pattern may be arranged in the one area of the non-display area in a continuous linear pattern or a continuous curved pattern.

The first layer pattern may include a sacrificial layer pattern having the same material as that of the first electrode.

At least one inorganic encapsulation layer in the encapsulation layer may cover the first layer pattern.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

FIGS. 10A to 10D are plan views of embodiments of a sacrificial layer shown in

FIG. 9A illustrating various patterns of slits in the sacrificial layer.

DETAILED DESCRIPTION

Figure 1:
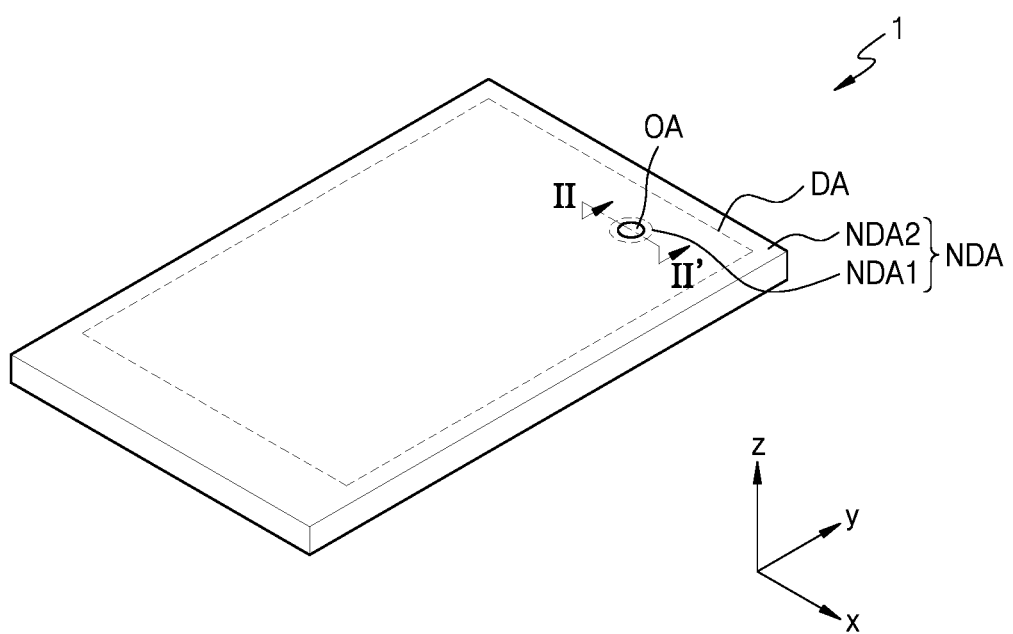
FIG. 1 is a perspective view of an embodiment of a display apparatus constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side"

(e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view of an embodiment of a display apparatus 1 constructed according to the principles of the invention.

Referring to FIG. 1, the display apparatus 1 includes a display area DA which emits light and a non-display area NDA which does not emit light. The non-display area NDA may be adjacent to the display area DA. The display apparatus 1 may provide certain images by using light emitted from a plurality of pixels in the display area DA.

The display apparatus 1 includes an opening area OA which is at least partially surrounded by the display area DA. As an embodiment, the opening area OA may be entirely surrounded by the display area DA.

The non-display area NDA may include a first non-display area NDA1 surrounding the opening area OA and a second non-display area NDA2 surrounding the periphery of the display area DA. The first non-display area NDA1 may entirely surround the opening area OA, the display area DA may entirely surround the first non-display area NDA1, and the second non-display area NDA2 may entirely surround the display area DA.

Hereinafter, the display apparatus 1 is described as an organic light-emitting display apparatus as an example, but is not limited thereto. As another embodiment, the display apparatus 1 may include an inorganic light-emitting display apparatus, a quantum dot light-emitting display apparatus, or the like.

Figure 2:
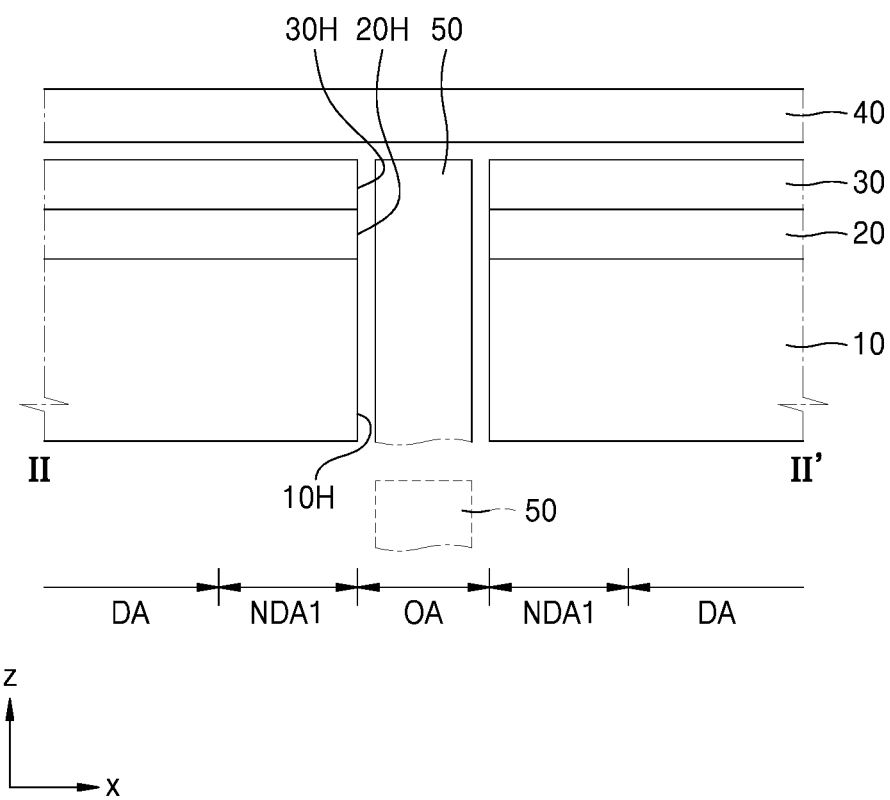
FIG. 2 is a cross-sectional view taken along line II-II' of FIG. 1.

FIG. 2 is a cross-sectional view of the display apparatus 1 taken along line II-II' of FIG. 1.

Referring to FIG. 2, the display apparatus 1 may include a display panel 10, an input sensing member 20 on the display panel 10, and an optical functional member 30. The display panel 10, the input sensing member 20, and the optical functional member 30 may be covered by a window 40. The display apparatus 1 may take the form of or be incorporated into various electronic devices such as a smart phone, a notebook computer, and a smart watch, as some non-limiting examples.

The display panel 10 may display an image. The display panel 10 includes a plurality of pixels in the display area DA. The plurality of pixels may include a light-emitting element and a pixel circuit connected thereto. The light-emitting element may include an organic light-emitting diode, an inorganic light-emitting diode, a quantum dot light-emitting diode, or the like.

The input sensing member 20 may obtain coordinate information according to an external input, for example, a touch event. The input sensing member 20 may include a sensing electrode and a trace line connected to the sensing electrode. The input sensing member 20 may be arranged on the display panel 10.

The input sensing member 20 may be directly formed on the display panel 10, or may be separately formed and then adhered to the display panel 10 through an optical clear adhesive (OCA). For example, the input sensing member 20 may be continuously formed after an operation of forming the display panel 10, and in this case, an adhesive layer may not be between the input sensing member 20 and the display panel 10. Although the input sensing member 20 is illustrated as being between the display panel 10 and the optical functional member 30, as another embodiment, the input sensing member 20 may be on the optical functional member 30.

The optical functional member 30 may include an anti-reflection layer. The anti-reflection layer may reduce the reflectance of external light incident from the outside toward the display panel 10 through the window 40. The anti-reflection layer may include a retarder and a polarizer. The retarder may be a film type or a liquid-crystal coating type, and may include a λ/2 retarder and/or a λ/4 retarder. The polarizer may also be a film type or a liquid-crystal coating type. The film-type polarizer may include a stretch-type synthetic resin film, and the liquid-crystal-coating-type polarizer may include a plurality of liquid-crystals having a certain arrangement. The retarder and the polarizer may further include a protective film. The retarder and the polarizer or the protective film may be defined as a base layer of the anti-reflection layer.

As another embodiment, the anti-reflection layer may include a black matrix and color filters. The color filters may be arranged considering a color of light emitted from each of the plurality of pixels. As another embodiment, the anti-reflection layer may include a destructive interference structure. The destructive interference structure may include a first reflective layer and a second reflective layer which are on different layers. First reflected light and second reflected light respectively reflected from the first reflective layer and the second reflective layer may destructively interfere, and thus, the reflectance of external light may be reduced.

The optical functional member 30 may include a lens layer. The lens layer may improve light emission efficiency of light emitted from the display panel 10 or reduce color deviation. The lens layer may include a layer having a concave or convex lens shape, or may include a plurality of layers having different refractive indices. The optical functional member 30 may include all of the anti-reflection layer and the lens layer, or may include any one of the anti-reflection layer and the lens layer.

The display panel 10, the input sensing member 20, and the optical functional member 30 may include openings. In detail, the display panel 10, the input sensing member 20, and the optical functional member 30 may respectively include first to third openings 10H, 20H, and 30H. The first to third openings 10H, 20H, and 30H may overlap each other. The first to third openings 10H, 20H, and 30H may correspond to the opening area OA. As another embodiment, at least one of the display panel 10, the input sensing member 20, and the optical functional member 30 may not include an opening.

A component 50 may be received in the opening area OA. The component 50 may be located in the first to third openings as shown by a solid line, or may be below the display panel 10 as shown by a dotted line.

The component 50 may include an electronic element such as an electronic element using light or sound. The electronic element may include a sensor receiving and using light, such as an infrared sensor, a camera capturing an image by receiving light, a sensor outputting and sensing light or sound to measure a distance or recognize a fingerprint or the like, a small lamp outputting light, a speaker outputting sound, or the like.

An electronic element using light may use light of various wavelengths, such as visible light, infrared light, ultraviolet light, or the like. As an embodiment, the opening area OA may be understood as a transmission area through which light or sound output from the component 50 to the outside or from the outside toward the electronic element may pass.

As another embodiment, when the display apparatus 1 is used as a smart watch or an instrument panel for vehicles, the component 50 may be a member including the hand of a clock, a needle indicating certain information (for example, speed of a vehicle, or the like), or the like. When the display apparatus 1 includes the hand of a clock or the instrument panel for vehicles, a portion of the component 50 may be exposed to the outside through the window 40, and the window 40 may include an opening corresponding to the opening area OA.

The component 50 may include a component associated with a function of the display panel 10, or may include a component such as accessories that increase aesthetics of the display panel 10.

Figure 3:
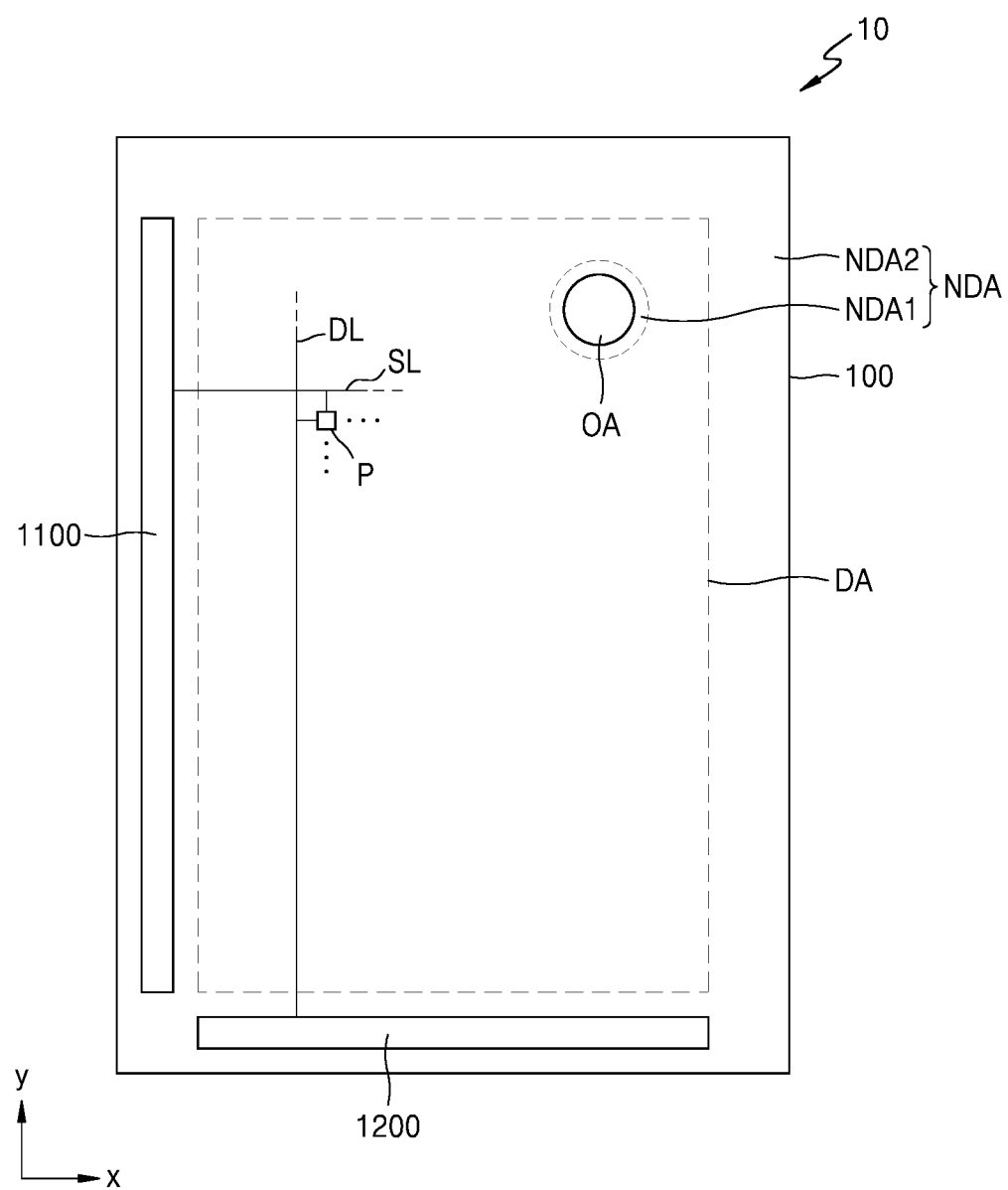
FIG. 3 is a plan view of an embodiment of a display panel included in the display apparatus of FIG. 1.
Figure 4:
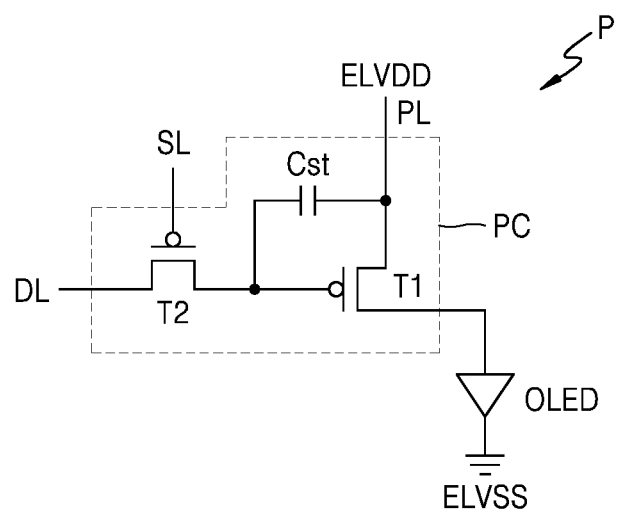
FIG. 4 is an equivalent circuit diagram of an embodiment of a representative pixel of the display panel of FIG. 3.

FIG. 3 is a plan view of an embodiment of a display panel 10 included in the display apparatus of FIG. 1, and FIG. 4 is an equivalent circuit diagram of an embodiment of a representative pixel of the display panel 10 of FIG. 3.

Referring to FIGS. 3 and 4, the display panel 10 includes the display area DA and the first and second non-display areas NDA1 and NDA2. A substrate 100 of FIG. 3 may be understood as a substrate provided in the display panel 10. For example, the substrate 100 may be understood as including the opening area OA, the display area DA, the first and second non-display areas NDA1 and NDA2.

The display panel 10 includes a plurality of pixels P in the display area DA. As shown in FIG. 4, each of the plurality of pixels P includes a pixel circuit PC and an organic light-emitting diode OLED as a light-emitting element connected to the pixel circuit PC. The pixel circuit PC may include a driving thin-film transistor T1, a switching thin-film transistor T2, and a storage capacitor Cst. Each pixel P may emit, for example, red, green, blue, or white light through the organic light-emitting diode OLED.

Referring to FIG. 4, the switching thin-film transistor T2 may be connected to a scan line SL and a data line DL, and be configured to deliver, to the driving thin-film transistor T1, a data voltage input from the data line DL based on a switching voltage input from the scan line SL. The storage capacitor Cst may be connected to the switching thin-film transistor T2 and a driving voltage line PL, and store a voltage corresponding to a difference between a voltage received from the switching thin-film transistor T2 and a first power supply voltage ELVDD supplied to the driving voltage line PL.

The driving thin-film transistor T1 may be connected to the driving voltage line PL and the storage capacitor Cst and may control a driving current flowing from the driving voltage line PL to the organic light-emitting diode OLED in accordance with a voltage value stored in the storage capacitor Cst.

The organic light-emitting diode OLED may emit light having a certain brightness according to the driving current. A second electrode (for example, a cathode) of the organic light-emitting diode OLED may receive a second power supply voltage ELVSS.

Although FIG. 4 describes that the pixel circuit PC includes two thin-film transistors and one storage capacitor, the embodiments are not limited thereto. The number of thin-film transistors and the number of storage capacitors may be variously changed according to the design of the pixel circuit PC.

Referring to FIG. 3 again, the first non-display area NDA1 may surround the opening area OA. The first non-display area NDA1 may be an area without a light-emitting element such as an organic light-emitting diode configured to emit light.

Signal lines (e.g., data lines DL and scan lines SL shown in FIG. 5) providing signals to the plurality of pixels P located around the opening area OA may pass by the first non-display area NDA1. A scan driver 1100 providing a scan signal to each of the plurality of pixels P, a data driver 1200 providing a data signal to each of the plurality of pixels P, a main power-supply wiring configured to provide first and second power-supply voltages, or the like may be arranged in the second non-display area NDA2. As an embodiment, the data driver 1200 is illustrated as being arranged at a lower end of the substrate 100, but as another embodiment, the data driver 1200 may be arranged on a flexible printed circuit board (FPCB) electrically connected to a pad arranged at a lower end of the display panel 10.

Figure 5:
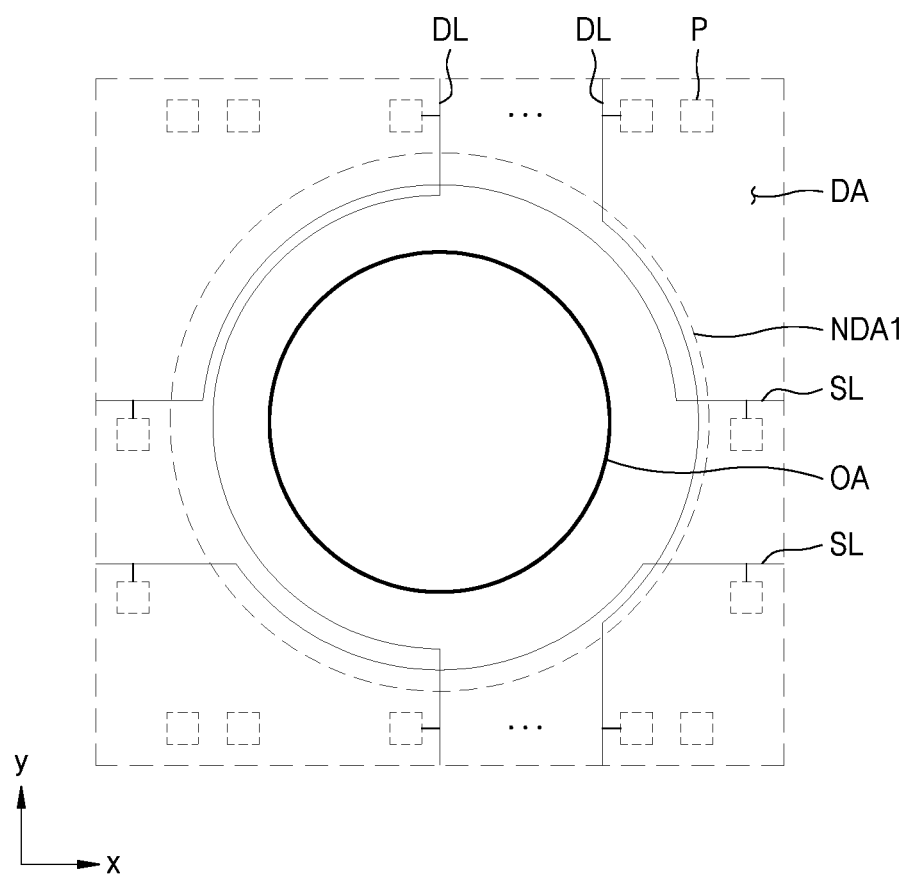
FIG. 5 is an enlarged plan view of signal lines in a first non-display area of the display panel of FIG. 3.

FIG. 5 is an enlarged plan view of signal lines in the first non-display area NDA1 of the display panel of FIG. 3.

Referring to FIG. 5, the plurality of pixels P may be arranged in the display area DA around the opening area OA, and the first non-display area NDA1 may be located between the opening area OA and the display area DA.

The plurality of pixels P may be apart from each other around the opening area OA. The plurality of pixels P may be vertically spaced apart from each other around the opening area OA, or may be horizontally spaced apart from each other around the opening area OA.

Signal lines adjacent to the opening area OA among signal lines supplying signals to the plurality of pixels P may bypass the opening area OA. For example, among data lines DL passing by the display area DA, some data lines DL may extend in a y-direction to provide data signals to the plurality of pixels P vertically arranged with the opening area OA therebetween, and may bypass an edge of the opening area OA in the first non-display area NDA1. Among scan lines SL passing by the display area DA, some scan lines SL may extend in an x-direction to provide scan signals to the plurality of pixels P horizontally arranged with the opening area OA therebetween, and may bypass the edge of the opening area OA in the first non-display area NDA1.

Figure 6:
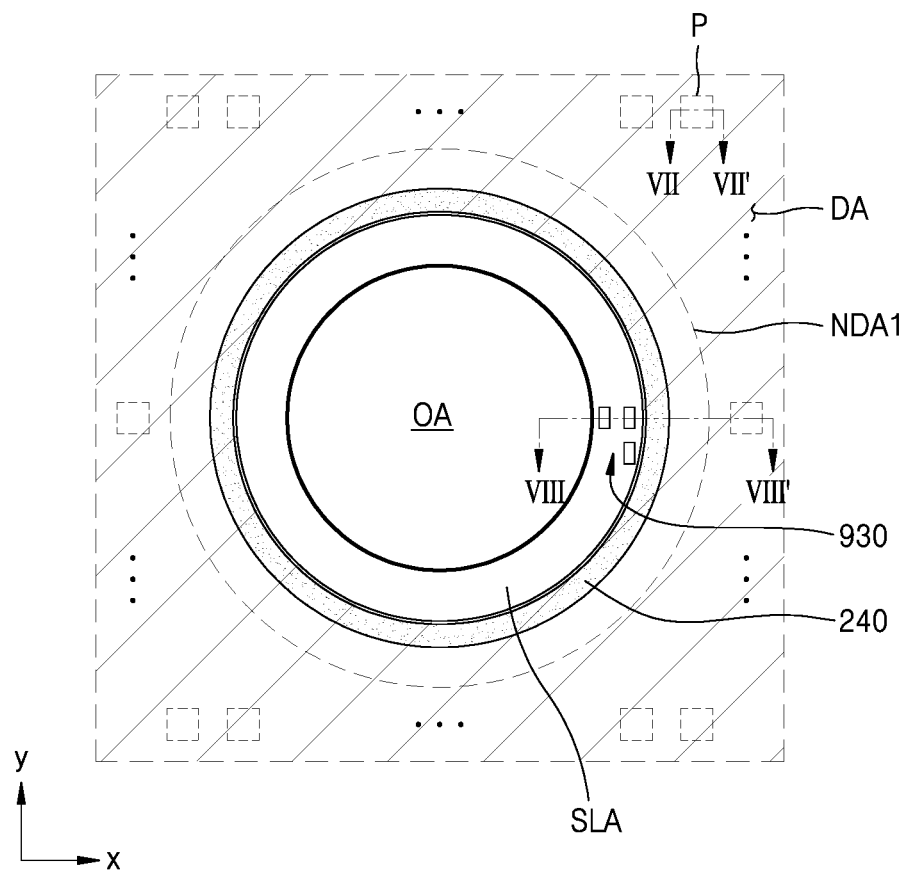
FIG. 6 is an enlarged plan view of an area of the display panel of FIG. 3.adjacent to the first non-display area

FIG. 6 is an enlarged plan view of an area of the display panel of FIG. 3 adjacent to the first non-display area.

Referring to FIG. 6, at least one dam 240 may be located between the opening area OA and the display area DA. A plurality of dams 240 apart from each other may be provided. The dam 240 may have a multi-layered structure. The dam 240 may be on one of insulating layers on the substrate (100 in FIG. 3). In the first non-display area NDA1, the dam 240 may have an annular shape that entirely surrounds the opening area OA. The inner diameter of the annular shape may be greater than the outer diameter of the opening area OA.

A sacrificial layer area SLA, which is a non-display area between the dam 240 and the opening area OA, may be an area from which first and second functional layers 222a and 222c of an intermediate layer (222 of FIG. 7A) including an organic material and a second electrode 223 are removed. The sacrificial layer area SLA may prevent penetration of foreign substances such as moisture or the like through the opening area OA. A sacrificial layer pattern 930 to be described below may be arranged in the sacrificial layer area SLA.

Figure 7A:
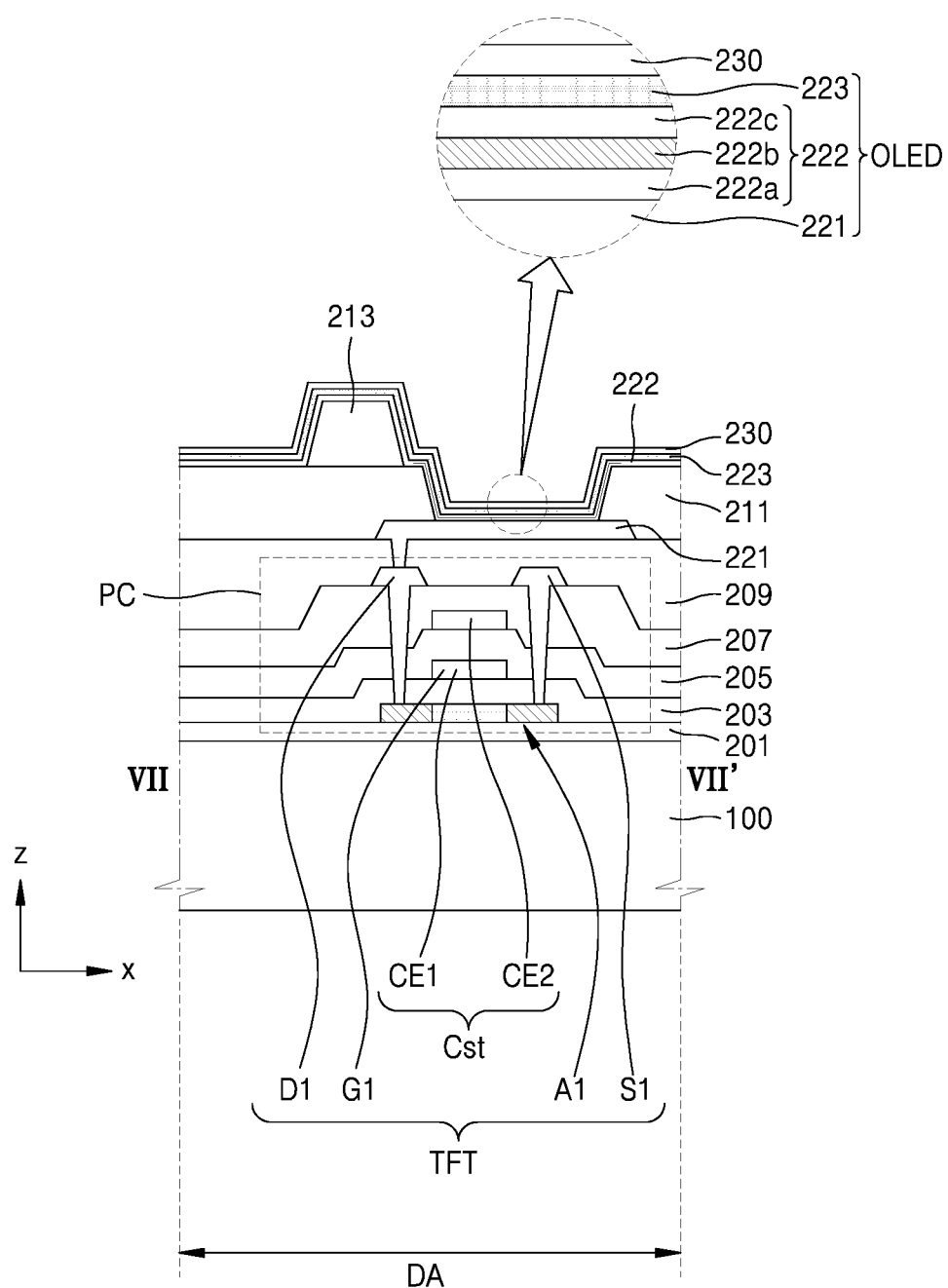
FIGS. 7A and 7B are cross-sectional views of embodiments taken along line VII-VII' of FIG. 6.

FIG. 7A is a cross-sectional view of an embodiment of the pixel taken along line VII-VII' of FIG. 6.

Referring to FIG. 7A, the pixel circuit PC and the organic light-emitting diode OLED electrically connected to the pixel circuit PC may be in the display area DA. The pixel circuit PC may be on the substrate 100, and the organic light-emitting diode OLED may be on the pixel circuit PC.

The substrate 100 may include a polymer resin or glass. As an embodiment, the substrate 100 may include a polymer resin such as polyethersulphone, polyacrylate, polyetherimide, polyethylene naphthalate, polyethylene terephthalate, polyphenylene sulfide, polyimide, polycarbonate, cellulose acetate propionate, or the like, and may be flexible. As another embodiment, the substrate 100 may include glass containing $SiO_2$ as a main component, or may include a resin such as reinforced plastic, and may be rigid.

A buffer layer 201 may be formed on the substrate 100 to prevent impurities from penetrating into a first semiconductor layer A1 of a first thin-film transistor TFT. The buffer layer 201 may include an inorganic material such as an oxide or a nitride, an organic material, or an organic and inorganic composite, and may be a single layer or a multi-layer. A barrier layer blocking penetration of external air may be further included between the substrate 100 and the buffer layer 201. In some embodiments, the buffer layer 201 may include silicon oxide ($SiO_2$) or silicon nitride (SiNX).

The pixel circuit PC may be disposed on the buffer layer 201. The pixel circuit PC includes the first thin-film transistor TFT and the storage capacitor Cst. The first thin-film transistor TFT may include the first semiconductor layer A1, a first gate electrode G1, a first source electrode S1, and a first drain electrode D1. The first thin-film transistor TFT may correspond to the driving thin-film transistor T1 of FIG. 4.

As an embodiment, the first thin-film transistor TFT is shown as a top-gate type in which the first gate electrode G1 is above the first semiconductor layer A1 with a first gate insulating layer 203 therebetween, but as another embodiment, the first thin-film transistor TFT may be a bottom-gate type.

The first semiconductor layer A1 may include polysilicon (Poly-Si). Alternatively, the first semiconductor layer A1 may include amorphous-Si, an oxide semiconductor, an organic semiconductor, or the like. The first gate electrode G1 may include a low-resistance metal material. The first gate electrode G1 may include a conductive material including molybdenum (Mo), aluminum (Al), copper (Cu), titanium (Ti), or the like, and may be a single layer or a multi-layer.

The first gate insulating layer 203 between the first semiconductor layer A1 and the first gate electrode G1 may include an inorganic insulating material such as silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like. The first gate insulating layer 203 may be a single layer or a multi-layer.

The first source electrode S1 and the first drain electrode D1 may include a material having good conductivity. The first source electrode S1 and the first drain electrode D1 may include a conductive material including Mo, Al, Cu, Ti, or the like, and may be a single layer or a multi-layer. As an embodiment, the first source electrode S1 and the first drain electrode D1 may be a multi-layer of Ti/Al/Ti.

The storage capacitor Cst may include a lower electrode CE1 and an upper electrode CE2 which overlap each other with a second gate insulating layer 205 therebetween.

The storage capacitor Cst may overlap the first thin-film transistor TFT. In detail, the first gate electrode G1 of the first thin-film transistor TFT may be the lower electrode CE1 of the storage capacitor Cst. As another embodiment, the storage capacitor Cst may not overlap the first thin-film transistor TFT.

The upper electrode CE2 of the storage capacitor Cst may include a conductive material including Mo, Al, Cu, Ti, or the like, and may be a single layer or a multi-layer.

The second gate insulating layer 205 may perform the function of a dielectric layer of the storage capacitor Cst. The second gate insulating layer 205 may include an inorganic insulating material such as silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zinc oxide (ZnO), or the like. The second gate insulating layer 205 may be a single layer or a multi-layer.

An interlayer insulating layer 207 may cover the storage capacitor Cst. The interlayer insulating layer 207 may include an inorganic insulating material such as silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zinc oxide (ZnO), or the like. The interlayer insulating layer 207 may be a single layer or a multi-layer.

A planarization layer 209 may cover the pixel circuit PC including the first thin-film transistor TFT and the storage capacitor Cst. An upper surface of the planarization layer 209 may be a flat surface. The planarization layer 209 may include a general commercial polymer such as poly(methyl methacrylate) (PMMA) or polystyrene (PS), a polymer derivative having a phenol group, an acrylic polymer, an imide polymer, an aryl ether polymer, an amide polymer, a fluorine polymer, a p-xylene polymer, a vinyl alcohol polymer, a mixture thereof, or the like. As an embodiment, the planarization layer 209 may include polyimide. As another embodiment, the planarization layer 209 may include an inorganic insulating material, or may include an inorganic and organic insulating material.

A first electrode 221 may be formed on the planarization layer 209. The first electrode 221 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. As another embodiment, the first electrode 221 may include a conductive oxide such as indium tin oxide (ITO), indium zinc oxide (IZO), zinc oxide (ZnO), indium oxide (In2O3), indium gallium oxide (IGO), and aluminum zinc oxide (AZO). As another embodiment, the first electrode 221 may further include a film including one of ITO, IZO, ZnO, and In2O3 above and below the reflective film. For example, the first electrode 221 may have a structure in which ITO/Ag/ITO are stacked. The first electrode 221 may include the same material as a sacrificial layer to be described below.

A pixel defining film 211 may be formed on the first electrode 221. The pixel defining film 211 may include an opening exposing an upper surface of the first electrode 221 and may cover an edge of the first electrode 221. Accordingly, the pixel defining film 211 may define an emission area of a pixel. The pixel defining film 211 may include an organic insulating material. For example, the pixel defining film 211 may include an organic insulating material such as polyimide, polyamide, an acrylic resin, benzocyclobutene, hexamethyldisiloxane (HMDSO), a phenol resin, or the like, and may be formed in a spin coating method or the like.

An intermediate layer 222 may be on an upper surface of the first electrode 221. The intermediate layer 222 includes an emission layer 222b. The intermediate layer 222 may include a first functional layer 222a below the emission layer 222b and a second functional layer 222c on the emission layer 222b. The emission layer 222b may include a polymer organic material or a low-molecular-weight organic material which emits light of a color.

The first functional layer 222a may be a single layer or a multi-layer. For example, when the first functional layer 222a includes a polymer material, the first functional layer 222a may be a hole transport layer (HTL) having a single-layered structure and may include poly-(3,4)-ethylene-dihydroxy thiophene (PEDOT) or polyaniline (PANI). When the first functional layer 222a includes a low-molecular-weight material, the first functional layer 222a may include a hole injection layer (HIL) and an HTL.

The second functional layer 222c may be omitted. For example, when the first functional layer 222a and the emission layer 222b include a polymer material, forming the second functional layer 222c is preferable. The second functional layer 222c may be a single layer or a multi-layer. The second functional layer 222c may include an electron transport layer (ETL) or an electron injection layer (EIL).

The emission layer 222b may be arranged for each pixel in the display area DA. The emission layer 222b may be arranged above the first electrode 221 exposed through the opening of the pixel defining film 211. The first and second functional layers 222a and 222c provided in the intermediate layer 222 may extend from the display area DA to the first non-display area NDA1.

A second electrode 223 may be on the intermediate layer 222. The second electrode 223 may include a conductive material having a low work function. For example, the second electrode 223 may include a (semi)transparent layer including Ag, Mg, Al, Pt, Pd, Au, Ni, Nd, Ir, Cr, lithium (Li), calcium (Ca), alloys thereof, or the like. As another embodiment, the second electrode 223 may further include a layer such as ITO, IZO, ZnO, In2O3 above the (semi)transparent layer including the above-stated material. The second electrode 223 may extend from the display area DA to the first non-display area NDA1. The intermediate layer 222 and the second electrode 223 may be formed by thermal deposition.

A spacer 213 may be formed on the pixel defining film 211. The spacer 213 may include an organic insulating material such as polyimide. The spacer 213 may include the same material as the pixel defining film 211. In this case, the pixel defining film 211 and the spacer 213 may be formed together in a mask operation using a halftone mask or the like. As another embodiment, the spacer 213 may include a material different from that of the pixel defining film 211.

A capping layer 230 may be on the second electrode 223. The capping layer 230 is a layer configured to protect the second electrode 223, which may include an inorganic material or an organic material. As an embodiment, the capping layer 230 may be omitted.

Figure 7B:
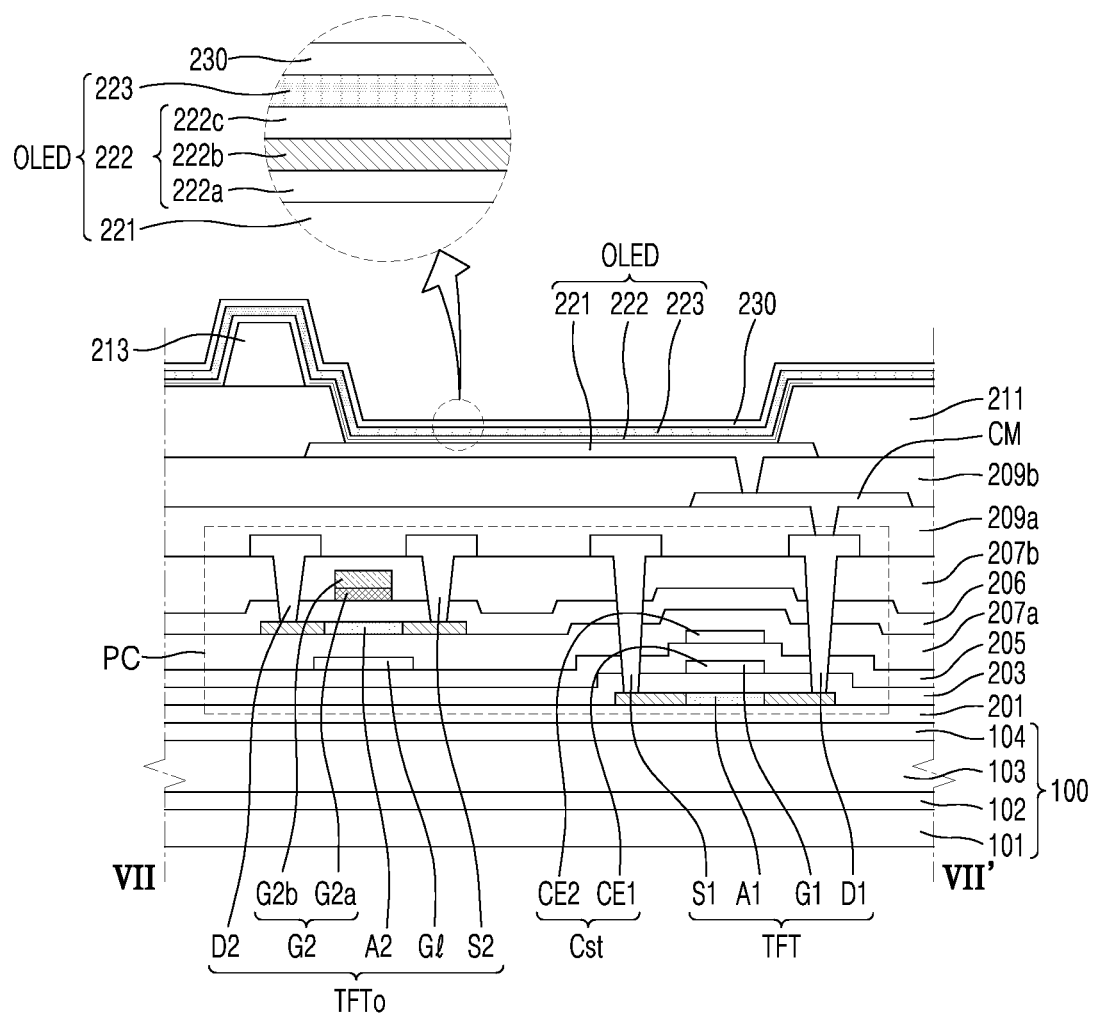

FIG. 7B is a cross-sectional view of another embodiment of the pixel taken along line VII-VII' of FIG. 6. In FIG. 7B, the same reference numerals as those in FIG. 7A denote the same or similar members, and thus, repetitive descriptions thereof will be omitted to avoid redundancy.

Referring to FIG. 7B, the pixel circuit PC and the organic light-emitting diode OLED electrically connected to the pixel circuit PC may be in the display area DA. The pixel circuit PC may include the first thin-film transistor TFT including the first semiconductor layer A1 including polycrystalline silicon and a second thin-film transistor TFTo including a second semiconductor layer A2 including an oxide semiconductor.

The first thin-film transistor TFT may include the first semiconductor layer A1, the first gate electrode G1, the first source electrode S1, and the first drain electrode D1. The first thin-film transistor TFT is substantially the same as the first thin-film transistor TFT of FIG. 7A, and the first semiconductor layer A1 of the first thin-film transistor TFT may include polycrystalline silicon.

Insulating layers of the illustrated embodiment include a first interlayer insulating layer 207a, a second interlayer insulating layer 207b, a first planarization layer 209a, and a second planarization layer 209b.

As an embodiment, the substrate 100 may be a multi-layered structure. The substrate 100 may include a first base layer 101, a first inorganic barrier layer 102, a second base layer 103, and a second inorganic barrier layer 104 which are sequentially stacked. Each of the first base layer 101 and the second base layer 103 may include a polymer resin. Each of the first inorganic barrier layer 102 and the second inorganic barrier layer 104 may be a barrier layer that prevents penetration of foreign substances from the outside, which may include an inorganic material such as silicon oxide (SiO2), silicon nitride (SiNx), silicon oxynitride (SiON), and amorphous silicon (a-Si). Each of the first inorganic barrier layer 102 and the second inorganic barrier layer 104 may be a single layer or a multi-layer.

The second thin-film transistor TFTo may include a second semiconductor layer A2, a second gate electrode G2, a second source electrode S2, and a second drain electrode D2. In addition, the second thin-film transistor TFTo may further include a lower gate electrode G ℓ.

The second semiconductor layer A2 may be on the first interlayer insulating layer 207a. In detail, the second semiconductor layer A2 may be on a different layer from that of the first semiconductor layer A1. The second semiconductor layer A2 may include a channel area, a source area, and a drain area, the source area and the drain area being respectively on both sides of the channel area.

As an embodiment, the second semiconductor layer A2 may include an oxide semiconductor. For example, the second semiconductor layer A2 may include a zinc-oxide-based material, and may include Zn oxide, In—Zn oxide, Ga—In—Zn oxide, or the like. Alternatively, the second semiconductor layer A2 may include an In—Ga—Zn—O (IGZO), In—Sn—Zn—O (ITZO), or In—Ga—Sn—Zn—O (IGTZO) semiconductor, which includes a metal such as In, Ga, and tin (Sn) in ZnO.

The source area and the drain area of the second semiconductor layer A2 may be formed by adjusting a carrier concentration of an oxide semiconductor to make the source area and the drain area conductive. For example, the source area and the drain area of the second semiconductor layer A2 may be formed by increasing the carrier concentration through a plasma treatment using a hydrogen (H)-based gas, a fluorine (F)-based gas, or a combination thereof on the oxide semiconductor.

The second gate electrode G2 may overlap the channel area of the second semiconductor layer A2, and a third gate insulating layer 206 may be between the second semiconductor layer A2 and the second gate electrode G2. In detail, the second gate electrode G2 may be insulated from the second semiconductor layer A2 by the third gate insulating layer 206. The third gate insulating layer 206 may be formed on substantially the entire upper surface of the substrate 100, but is not limited thereto. The third gate insulating layer 206 may be patterned according to a shape of the second gate electrode G2.

The second gate electrode G2 may include a conductive material including Mo, Al, Cu, Ti, or the like, and may be a single layer or a multi-layer. The second gate electrode G2 may include a first layer G2a including Ti and a second layer G2b including Mo.

The third gate insulating layer 206 may include an inorganic material including an oxide or a nitride. For example, the third gate insulating layer 206 may include silicon oxide (SiO2), silicon nitride (SiNx), silicon oxynitride (SiON), aluminum oxide (Al2O3), titanium oxide (TiO2), tantalum oxide (Ta2O5), hafnium oxide (HfO2), zinc oxide (ZnO), or the like. The second gate electrode G2 may be on the third gate insulating layer 206, include Mo, Al, Cu, Ti, or the like, and be a single layer or a multi-layer.

The lower gate electrode G1 may be below the second semiconductor layer A2 to overlap the channel area of the second semiconductor layer A2. The lower gate electrode G1 may be on the same layer as the upper electrode CE2 of the storage capacitor Cst. The first interlayer insulating layer 207a may be between the lower gate electrode G1 and the second semiconductor layer A2.

The second interlayer insulating layer 207b may cover the second gate electrode G2 of the second thin-film transistor TFTo. The second source electrode S2 and the second drain electrode D2 may be on the second interlayer insulating layer 207b.

The first interlayer insulating layer 207a and the second interlayer insulating layer 207b may include an inorganic material including an oxide or a nitride. For example, the first interlayer insulating layer 207a and the second interlayer insulating layer 207b may include silicon oxide (SiO2), silicon nitride (SiNx), silicon oxynitride (SiON), aluminum oxide (Al2O3), titanium oxide (TiO2), tantalum oxide (Ta2O5), hafnium oxide (HfO2), zinc oxide (ZnO), or the like.

The second source electrode S2 and the second drain electrode D2 may be respectively connected to the source area and the drain area of the second semiconductor layer A2 through contact holes penetrating through the second interlayer insulating layer 207b and the third gate insulating layer 206. The second source electrode S2 and the second drain electrode D2 may include a conductive material including Mo, Al, Cu, Ti, or the like, and may be a single layer or a multi-layer.

The first thin-film transistor TFT including the first semiconductor layer A1 including polycrystalline silicon has high reliability, which may be used as a thin-film transistor to form a high-quality display panel.

Because the second thin-film transistor TFTo having the second semiconductor layer A2 including an oxide semiconductor has high carrier mobility and low leakage current, a voltage drop may not be large even when a driving time is long. That is, because color change of an image according to a voltage drop is not large even during low-frequency driving, the low-frequency driving is possible. Because an oxide semiconductor has an advantage of having a small leakage current, leakage current may be prevented and power consumption may be reduced at the same time by using an oxide semiconductor in at least one of other thin-film transistors other than the driving thin-film transistor.

The first planarization layer 209a and the second planarization layer 209b may be on the second interlayer insulating layer 207b. A conductive pattern such as a line or the like may be formed between the first planarization layer 209a and the second planarization layer 209b, and this is beneficial for high integration.

The first planarization layer 209a may cover the pixel circuit PC. The second planarization layer 209b may be on the first planarization layer 209a. The first planarization layer 209a and the second planarization layer 209b may include an organic material or an inorganic material, and may be a single layer or a multi-layer. The first planarization layer 209a and the second planarization layer 209b may include benzocyclobutene (BCB), polyimide, HMDSO, a general commercial polymer such as PMMA or PS, a polymer derivative having a phenol group, an acrylic polymer, an imide polymer, an aryl ether polymer, an amide polymer, a fluorine polymer, a p-xylene polymer, a vinyl alcohol polymer, or the like. As another embodiment, the first planarization layer 209a and the second planarization layer 209b may include an inorganic insulating material such as silicon oxide (SiO2), silicon nitride (SiNx), silicon oxynitride (SiON), aluminum oxide (Al2O3), titanium oxide (TiO2), tantalum oxide (Ta2O5), hafnium oxide (HfO2), zinc oxide (ZnO), or the like. When forming the first planarization layer 209a and the second planarization layer 209b, a chemical and mechanical polishing operation may be performed to provide a flat top surface.

The organic light-emitting diode OLED may be on the second planarization layer 209b. The first electrode 221 of the organic light-emitting diode OLED may be connected to the pixel circuit PC through a connection electrode CM on the first planarization layer 209a.

The connection electrode CM may be between the first planarization layer 209a and the second planarization layer 209b. The connection electrode CM may include a conductive material including Mo, Al, Cu, Ti, or the like, and may be a single layer or a multi-layer. For example, the connection electrode CM may have a multi-layered structure of Ti/Al/Ti.

Figure 8:
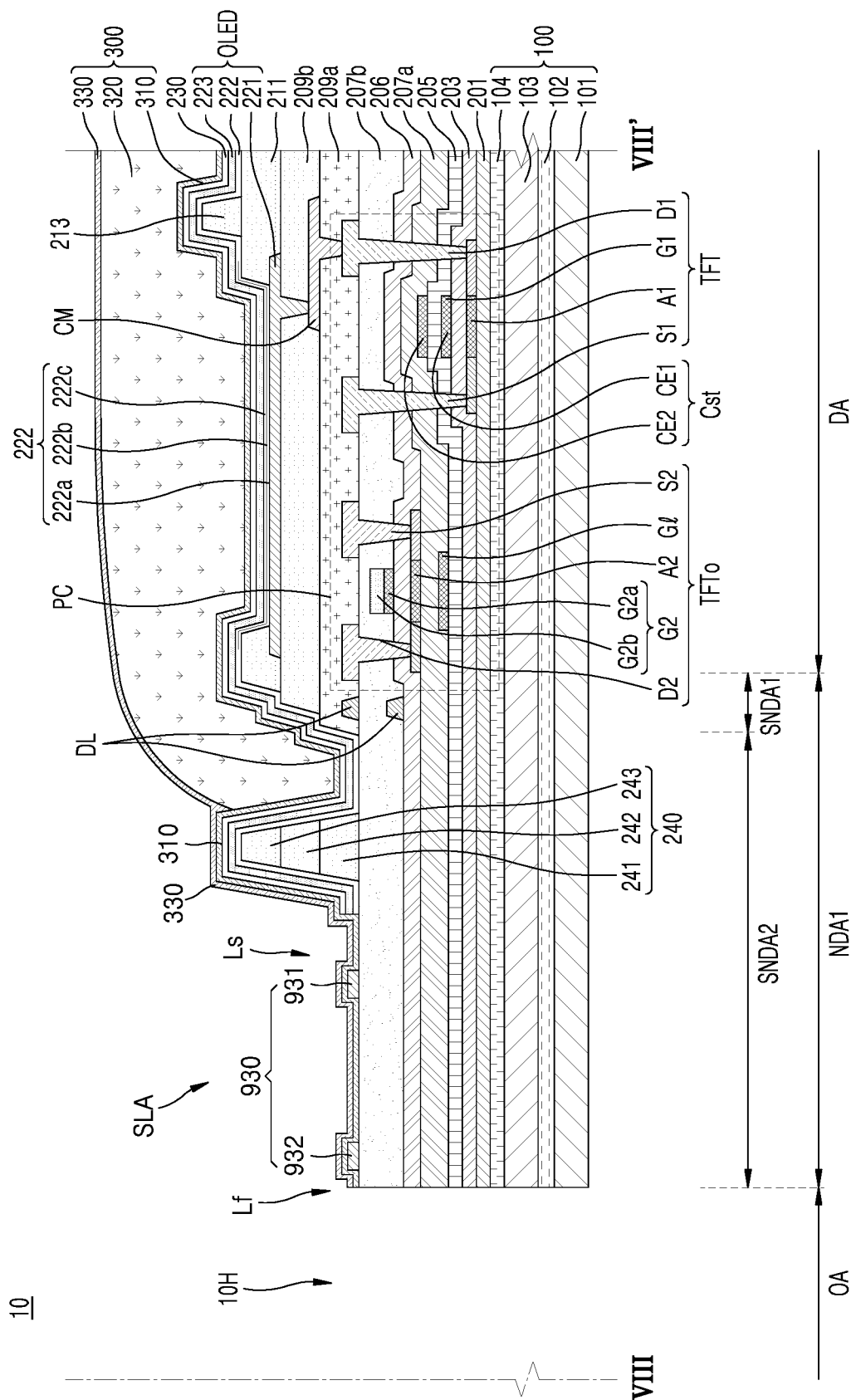
FIG. 8 is a cross-sectional view taken along line VIII-VIII' of FIG. 6.

FIG. 8 is a cross-sectional view of the display panel 10 taken along line VIII-VIII' of FIG. 6.

Referring to FIG. 8, the display panel 10 includes the opening area OA, the display area DA, and the first non-display area NDA1 between the opening area OA and the display area DA. The display panel 10 may include a first opening 10H corresponding to the opening area OA.

The display panel 10 is illustrated as using the pixel circuit PC of FIG. 7B, but the exemplary embodiments are not limited thereto. For example, the display panel 10 may use the pixel circuit PC of FIG. 7A.

Referring to the display area DA, the first thin-film transistor TFT, the second thin-film transistor TFTo, and the storage capacitor Cst on the substrate 100 may be in the display area DA.

A plurality of insulating layers 201 to 209b may be between semiconductor layers and electrodes of the first and second thin-film transistors TFT and TFTo and between electrodes of the storage capacitor Cst. The organic light-emitting diode OLED electrically connected to the pixel circuit PC and the capping layer 230 may be in the display area DA. A plurality of insulating layers 211 and 213 may be around the organic light-emitting diode OLED.

An encapsulation layer 300 may cover the organic light-emitting diode OLED having the first electrode 221, the intermediate layer 222, and the second electrode 223. The encapsulation layer 300 may include at least one organic encapsulation layer and at least one inorganic encapsulation layer. As an embodiment, the encapsulation layer 300 may include a first inorganic encapsulation layer 310, a second inorganic encapsulation layer 330, and an organic encapsulation layer 320 between the first inorganic encapsulation layer 310 and the second inorganic encapsulation layer 330. As another embodiment, the number of organic encapsulation layers, the number of the inorganic encapsulation layers, and a stacking order thereof may be changed.

The first inorganic encapsulation layer 310 and the second inorganic encapsulation layer 330 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO), and may be formed by chemical vapor deposition (CVD) or the like. The organic encapsulation layer 320 may include a polymer-based material. The polymer-based material may include a silicone-based resin, an acryl-based resin, an epoxy-based resin, polyimide, polyethylene, or the like.

The first non-display area NDA1 may include a first sub-non-display area SNDA1 relatively adjacent to the display area DA and a second sub-non-display area SNDA2 relatively adjacent to the opening area OA or the first opening 10H.

The first sub-non-display area SNDA1 may be an area through which signal lines, for example, a plurality of data lines DL pass, as described in FIG. 5. The plurality of data lines DL may correspond to data lines DL bypassing the opening area OA. The first sub-non-display area SNDA may be a wiring area or a bypass area through which the plurality of data lines DL pass.

Referring to FIG. 8, the plurality of data lines DL may be on different layers with the second interlayer insulating layer 207b therebetween, and may overlap each other or alternate with each other. As another embodiment, the plurality of data lines DL may be on the same insulating layer. When the plurality of data lines DL are vertically arranged with an insulating layer therebetween, the distance between the plurality of data lines DL may be reduced, and thus, the width of the first non-display area NDA1 may be reduced. As another embodiment, a plurality of scan lines SL bypassing the opening area OA may also be located in the first sub-non-display area SNDA1.

A dam 240 may be in the second sub-non-display area SNDA2. As an embodiment, a multi-layered dam 240 may be on the second interlayer insulating layer 207b. For example, as shown in FIG. 8, the dam 240 may include at least one layer. When forming the organic encapsulation layer 320 of the encapsulation layer 300, the dam 240 may control the flow of the organic encapsulation layer 320. The dam 240 may include a first layer 241, a second layer 242 on the first layer 241, and a third layer 243 on the second layer 242. The first layer 241 may be formed in the same operation as that of the second planarization layer 209b and include the same material as that of the second planarization layer 209b. The second layer 242 may be formed in the same operation as that of the pixel defining film 211 and include the same material as that of the pixel defining film 211. The third layer 243 may be formed in the same operation as that of the spacer 213 and include the same material as that of the spacer 213. When the dam 240 includes at least one of the insulating layers 201 to 213 formed on the substrate 100, it is not limited to any one insulating layer.

The first functional layer 222a, the second functional layer 222c, the second electrode 223 and the capping layer 230, which extend from the display area DA, may be on the dam 240. The emission layer 222b may not be on the dam 240. In other words, the intermediate layer 222 except for the emission layer 222b, the second electrode 223 and the capping layer 230, may be disposed on the dam 240.

The second sub-non-display area SNDA2 may include the sacrificial layer area SLA from which the organic material between the substrate 100 and the encapsulation layer 300 has been removed. The sacrificial layer area SLA may be an area between the dam 240 and the opening area OA. The sacrificial layer pattern 930 may be in the sacrificial layer area SLA. The sacrificial layer pattern 930 may be patterned during a lift-off operation of a sacrificial layer (910 of FIG. 9A), the first functional layer 222a, the second functional layer 222c, the second electrode 223, and the capping layer 230 by using a laser lift off (LLO) method.

The sacrificial layer pattern 930 includes a metal material. As an embodiment, the sacrificial layer pattern 930 may be formed of the same material as that of the first electrode 221 of the organic light-emitting diode OLED in the same operation as that of the first electrode 221 of the organic light-emitting diode OLED. For example, the sacrificial layer pattern 930 may have a structure in which ITO/Ag/ITO are stacked.

The sacrificial layer pattern 930 may be formed in at least one area of areas around a start point Ls where irradiation of a laser beam starts and around a finish point Lf where the irradiation of a laser beam is finished, during laser processing of the sacrificial layer area SLA. The sacrificial layer pattern 930 may include a first sacrificial layer pattern 931 and a second sacrificial layer pattern 932 in the sacrificial layer area SLA.

The first sacrificial layer pattern 931 may be spaced apart from the dam 240 around the start point Ls where the irradiation of a laser beam starts. At least one first sacrificial layer pattern 931 may be arranged in the sacrificial layer area SLA. The first sacrificial layer pattern 931 may have a discontinuous pattern form. For example, in the first sacrificial layer pattern 931, a plurality of linear patterns or a plurality of curved patterns may be apart from each other. As another embodiment, the first sacrificial layer pattern 931 may be a continuous pattern form. For example, in the first sacrificial layer pattern 931, a linear pattern or a curved pattern may extend in one direction of the sacrificial layer area SLA without disconnection.

The second sacrificial layer pattern 932 may be arranged in the sacrificial layer area SLA around the finish point Lf where the irradiation of a laser beam is finished, to be apart from the opening area OA. Similar to the first sacrificial layer pattern 931, at least one second sacrificial layer pattern 932 may be arranged in the sacrificial layer area SLA, and may have a pattern structure in which a linear pattern or a curved pattern is discontinuous. As another embodiment, at least one second sacrificial layer pattern 932 may be arranged in the sacrificial layer area SLA, and may have a structure in which a linear pattern or a curved pattern is continuous.

As described above, the first sacrificial layer pattern 931 and the second sacrificial layer pattern 932 may be respectively arranged on both edges of the sacrificial layer area SLA. The sacrificial layer pattern 930 may be arranged not only on both edges of the sacrificial layer area SLA, but also over the entire area of the sacrificial layer area SLA according to the degree of overlap of an irradiated laser beam. On the other hand, the first functional layer 222a, the second functional layer 222c, the second electrode 223, and the capping layer 230 may not be provided in the sacrificial layer area SLA.

The first inorganic encapsulation layer 310 may extend from the display area DA to the first non-display area NDA1. The first inorganic encapsulation layer 310 may cover the first sacrificial layer pattern 931 and the second sacrificial layer pattern 932. The second inorganic encapsulation layer 330 may cover the first inorganic encapsulation layer 310.

In the sacrificial layer area SLA, the first inorganic encapsulation layer 310 may be in contact with the second interlayer insulating layer 207b, which is an inorganic insulating layer exposed between the first sacrificial layer pattern 931 and the second sacrificial layer pattern 932. Because the first functional layer 222a, the second functional layer 222c, and the capping layer 230, which are organic materials, are not exposed on a sidewall of the first opening 10H, foreign substances such as moisture or the like may be prevented from penetrating into the organic light-emitting diode OLED through the first opening 10H.

In the first non-display area NDA1, the first inorganic encapsulation layer 310 may cover an outer surface of the dam 240. The organic encapsulation layer 320 may be formed by applying and curing a monomer. The flow of the monomer may be controlled by the dam 240. An end portion of the organic encapsulation layer 320 may be located on a side portion of the dam 240 facing the display area DA.

The second inorganic encapsulation layer 330 may cover the dam 240, as the first inorganic encapsulation layer 310. A portion of the second inorganic encapsulation layer 330 may be in contact with the first inorganic encapsulation layer 310. For example, in the second sub-non-display area SNDA2, a portion of the second inorganic encapsulation layer 330 may be in contact with the first inorganic encapsulation layer 310. The first inorganic encapsulation layer 310 and the second inorganic encapsulation layer 330 may also contact each other on an upper surface of the dam 240.

Figure 9A:
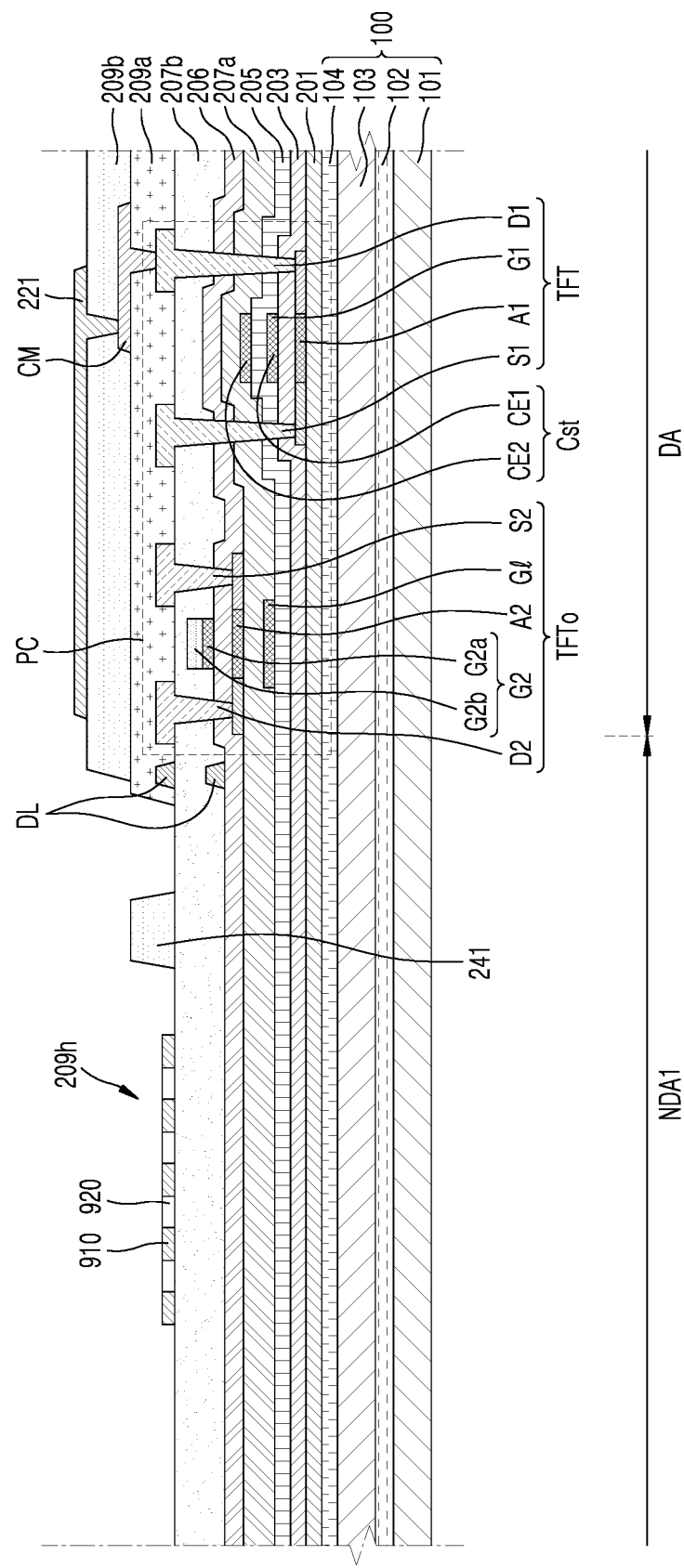
FIGS. 9A to 9E are cross-sectional views sequentially showing an illustrative method of manufacturing the display panel shown in FIG. 8.

FIGS. 9A to 9E are cross-sectional views sequentially showing an illustrative method of manufacturing the display panel 10 shown in FIG. 8. FIGS. 10A to 10D are plan views of embodiments of a sacrificial layer shown in FIG. 9A illustrating various patterns of slits in the sacrificial layer.

Referring to FIG. 9A, the pixel circuit PC including at least one thin-film transistor TFT and TFTo is formed in the display area DA. As an embodiment, the pixel circuit PC may include the first thin-film transistor TFT including a polysilicon semiconductor and a second thin-film transistor TFTo including an oxide semiconductor.

In the display area DA, the first planarization layer 209a covers the pixel circuit PC. The connection electrode CM is formed on the first planarization layer 209a. The second planarization layer 209b is formed on the connection electrode CM. The first electrode 221 connected to the connection electrode CM is formed on the second planarization layer 209b.

In the first non-display area NDA1, a first opening 209h is formed by patterning the first planarization layer 209a. The first layer 241 of a plurality of dams 240 is formed in the same operation as that of the second planarization layer 209b. The first layer 241 is on the second interlayer insulating layer 207b.

The sacrificial layer 910 is formed in the first non-display area NDA1. The sacrificial layer 910 is formed on the second interlayer insulating layer 207b through the first opening 209h. The sacrificial layer 910 may have an annular structure formed along a periphery of the opening area OA shown in FIG. 6.

The sacrificial layer 910 may be simultaneously formed when forming an element of the pixel circuit PC. For example, the sacrificial layer 910 may be formed in the same operation as that of the first electrode 221 electrically connected to the pixel circuit PC, and may include the same material as that of the first electrode 221. The sacrificial layer 910 may include a conductive oxide, a metal material, or a metal compound. The sacrificial layer 910 may further include a film including ITO, IZO, ZnO, and In2O3 above and below a reflective film including a metal. For example, the sacrificial layer 910 may have a structure in which ITO/Ag/ITO are stacked.

A plurality of slits 920 may be formed in the sacrificial layer 910. The plurality of slits 920 may penetrate completely through the material of the sacrificial layer 910 in the thickness direction of the sacrificial layer 910 in the first non-display area NDA1.

Figure 10A:
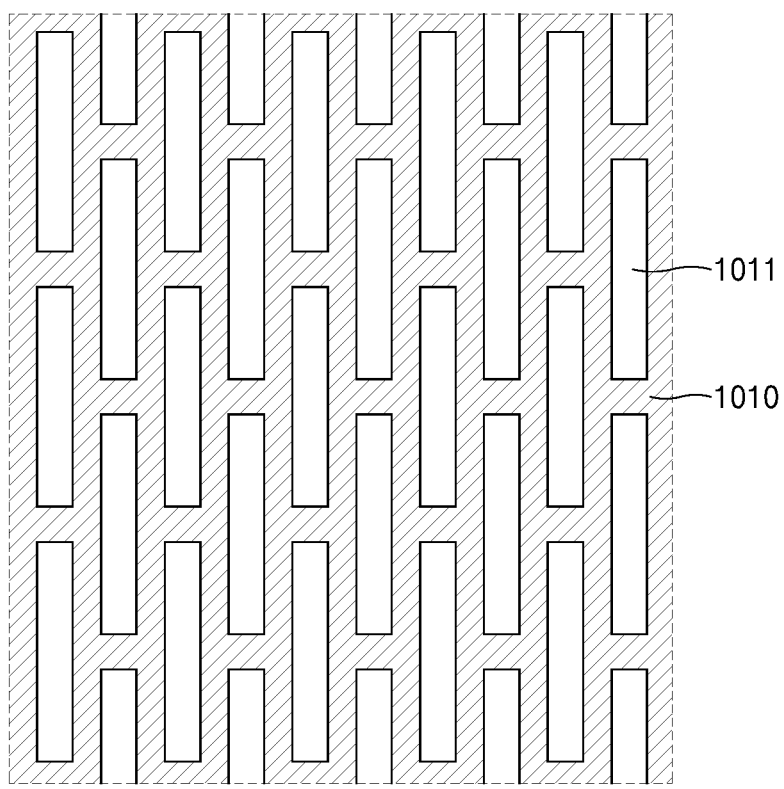

Referring to FIG. 10A, a plurality of slits 1011 may be formed over substantially the entire area of a sacrificial layer 1010. Each of the plurality of slits 1011 may have a generally rectangular pattern and may be apart from each other.

Figure 10B:
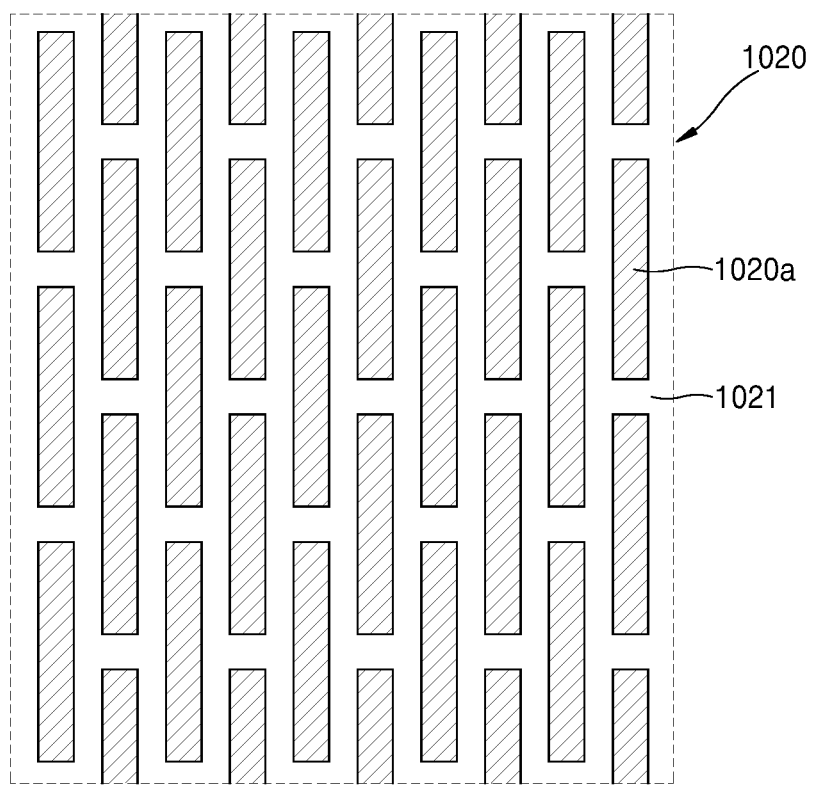

Referring to FIG. 10B, a sacrificial layer 1020 may be separated into a plurality of sacrificial layer portions 1020a. The plurality of sacrificial layer portions 1020a may be apart from each other. The plurality of sacrificial layer portions 1020a may have a generally rectangular pattern. A slit 1021 may be formed between the plurality of separated sacrificial layer portions 1020a. The slit 1021 may have a linear pattern.

Figure 10C:
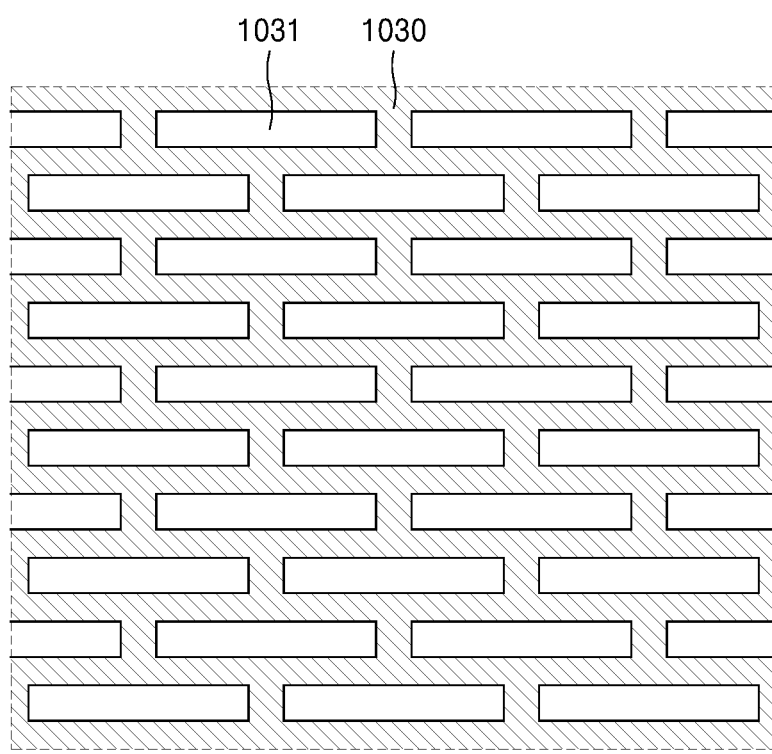

Referring to FIG. 10C, a plurality of slits 1031 may be formed over substantially the entire area of a sacrificial layer 1030. Each of the plurality of slits 1031 may have a shape obtained by rotating the slit 1011 of FIG. 10A by 90 degrees. Each of the plurality of slits 1031 may have a generally rectangular pattern and may be apart from each other.

Figure 10D:
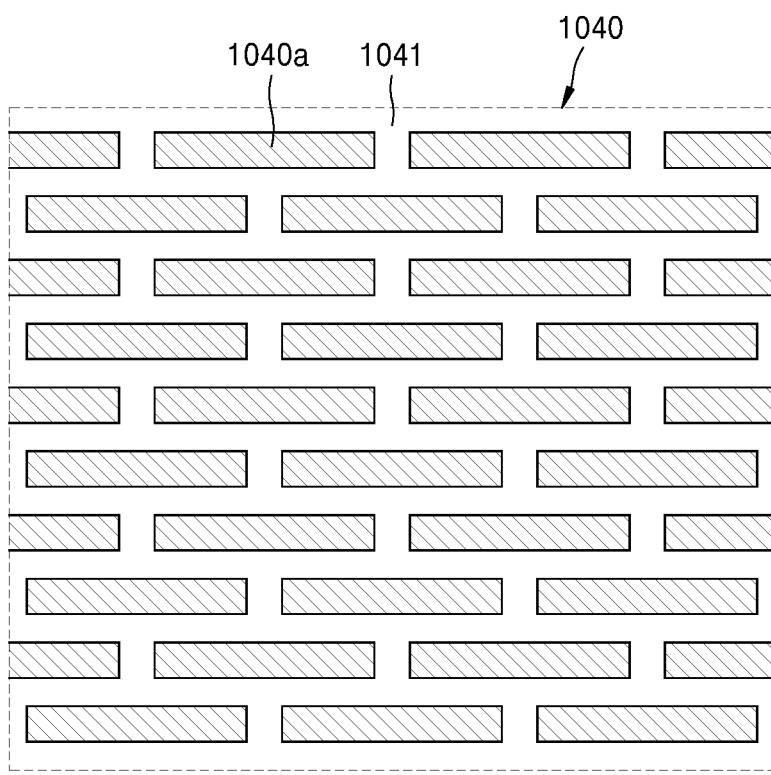

Referring to FIG. 10D, a sacrificial layer 1040 may be separated into a plurality of sacrificial layer portions 1040a. The plurality of sacrificial layer portions 1040a may have a shape obtained by rotating the sacrificial layer portion 1020a of FIG. 10B by 90 degrees. The plurality of sacrificial layer portions 1040a may be apart from each other. The plurality of sacrificial layer portions 1040a may have a generally rectangular pattern. A slit 1041 may be formed between the plurality of separated sacrificial layer portions 1040a. The slit 1041 may have a linear pattern.

Referring to FIG. 9A again, the plurality of slits 920 may be formed in various patterns other than a linear pattern or a curved pattern. In addition, the plurality of slits 920 may have a pattern form in which a linear pattern or a curved pattern over substantially the entire area of the sacrificial layer 910 is discontinuous. As another embodiment, the plurality of slits 920 may have a pattern form in which a linear pattern or a curved pattern over substantially the entire area of the sacrificial layer 910 is continuous.

Figure 9B:
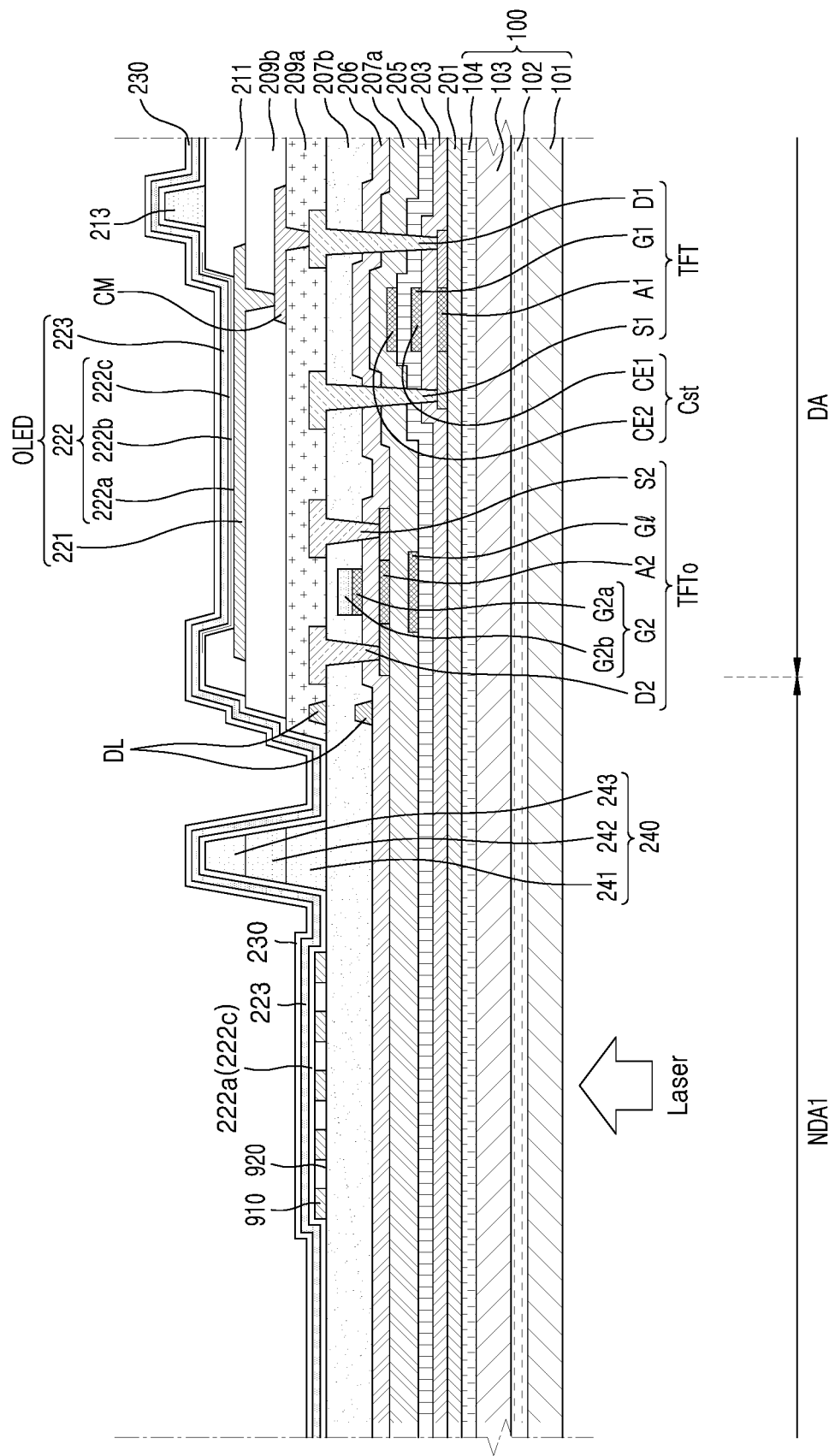

Referring to FIG. 9B, the pixel defining film 211 is formed on the first electrode 221 in the display area DA. The pixel defining film 211 is formed to expose a portion of the first electrode 221. The spacer 213 is formed on the pixel defining film 211.

In the first non-display area NDA1, the second layer 242 and the third layer 243 is sequentially formed on the first layer 241. The second layer 242 is formed in the same operation as that of the pixel defining film 211. The third layer 243 is formed in the same operation as that of the spacer 213. As an embodiment, the dam 240 of a triple layer is formed on the second interlayer insulating layer 207b. At least one dam 240 may be formed in the first non-display area NDA1.

In the display area DA, the organic light-emitting diode OLED electrically connected to the pixel circuit PC is formed. The intermediate layer 222 including the first functional layer 222a, the emission layer 222b, and the second functional layer 222c is formed on the first electrode 221, and the second electrode 223 is formed on the intermediate layer 222. The second electrode 223 may include a (semi) transparent layer including Ag, Mg, Al, Pt, Pd, Au, Ni, Nd, Ir, Cr, Li, Ca, alloys thereof, or the like. As another embodiment, the second electrode 223 may further include a layer such as ITO, IZO, ZnO, and In2O3 above the (semi) transparent layer including the above-stated material. As another embodiment, the second electrode 223 may include a metal material including Ag.

In the first non-display area NDA1, the first functional layer 222a, the second functional layer 222c, the second electrode 223, and the capping layer 230 are sequentially stacked on an outer surface of the dam 240 and an upper surface of the sacrificial layer 910.

The first functional layer 222a, the second functional layer 222c, the second electrode 223, and the capping layer 230 are formed on substantially the entire surface of the substrate 100. The first functional layer 222a, the second functional layer 222c, the second electrode 223, and the capping layer 230 integrally extend on the outer surface of the dam 240 and on the sacrificial layer 910 having the plurality of slits 920. The first functional layer 222a, the second functional layer 222c, the second electrode 223, and the capping layer 230 cover the sacrificial layer 910.

Figure 11A:
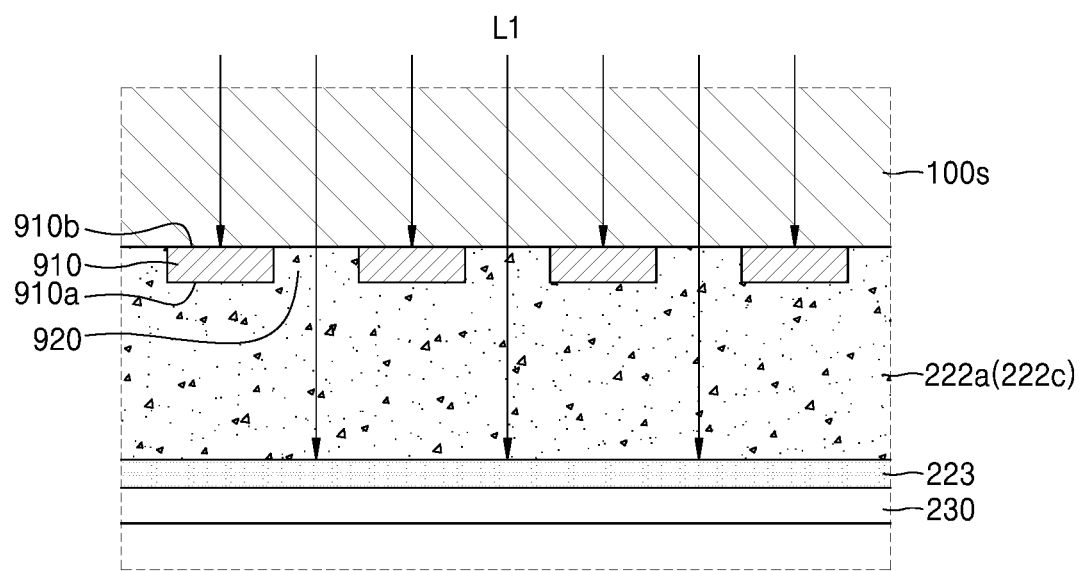
FIGS. 11A to 11C are cross-sectional views sequentially showing an illustrative operation of removing a sacrificial layer, a functional layer, and a second electrode, which are stacked, as shown in FIG. 9B, by irradiating a laser beam.
Figure 11B:
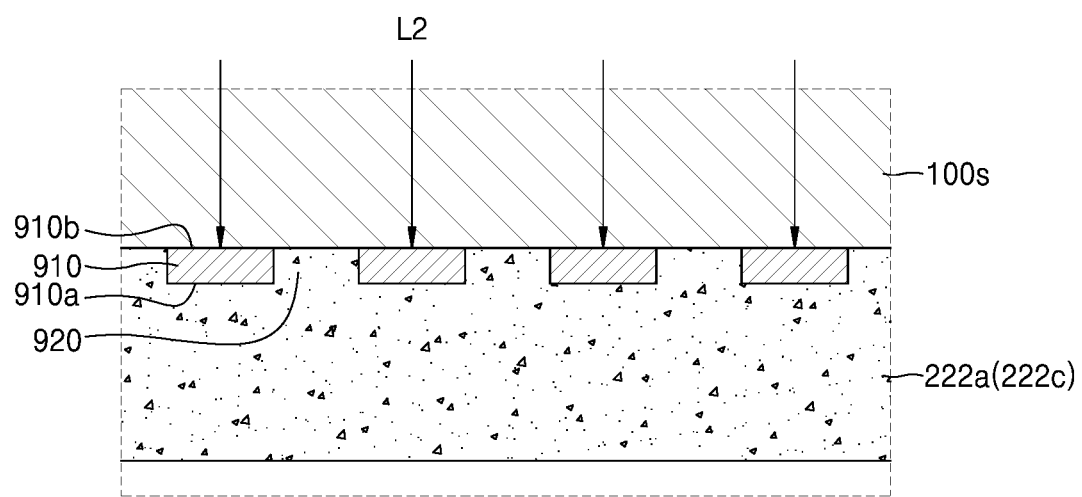
Figure 11C:
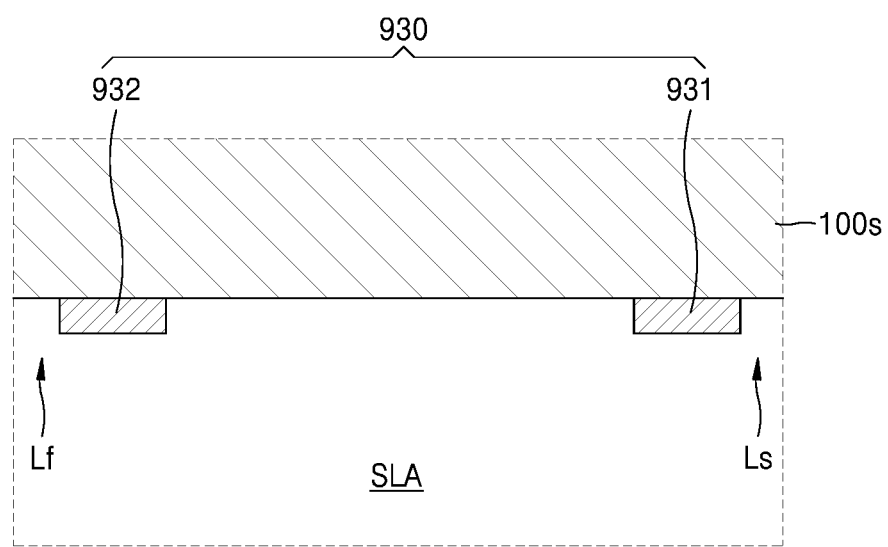

FIGS. 11A to 11C are cross-sectional views sequentially showing an illustrative operation of removing a sacrificial layer, a functional layer, and a second electrode, which are stacked, as shown in FIG. 9B, by irradiating a laser beam. Referring to FIG. 11A, the plurality of slits 920 are formed in the sacrificial layer 910. The first functional layer 222a and the second functional layer 222c are formed on a first surface 910a of the sacrificial layer 910 and in the plurality of slits 920. The first functional layer 222a and the second functional layer 222c integrally extend. The first surface 910a of the sacrificial layer 910 may be a surface opposite from a base 100s. The base 100s may correspond to an area from the substrate 100 of FIG. 8 to the second interlayer insulating layer 207b. The second electrode 223 is formed on the first functional layer 222a and the second functional layer 222c. The thickness of the first functional layer 222a and the second functional layer 222c is much greater than the thickness of the second electrode 223. For example, the thickness of the first functional layer 222a and the second functional layer 222c may be several tens of times greater than that of the second electrode 223. The capping layer 230 is formed on the second electrode 223.

Referring to FIG. 9B again, laser beams having different densities are irradiated to the sacrificial layer 910, the first functional layer 222a, the second functional layer 222c, the second electrode 223, and the capping layer 230 in two steps. When irradiating a 2-step laser beam, the sacrificial layer 910, the first functional layer 222a, the second functional layer 222c, the second electrode 223, and the capping layer 230 may be lifted off from the substrate 100. In other words, two laser beams (e.g., L1 and L2 shown in FIGS. 11A and 11B) having different densities can be irradiated to the layers by using a 2-step Laser Lift Off (LLO) method.

An operation in which the sacrificial layer 910, the first functional layer 222a, the second functional layer 222c, the second electrode 223, and the capping layer 230 are lifted off from the substrate 100 will be described in detail below, as shown in FIGS. 11A to 11C.

First, referring to FIG. 11A, a first laser beam L1 may have a wavelength of infrared light. When the laser beam is infrared light because the transmittance thereof with respect to the substrate 100 and insulating layers 201 to 207b of FIG. 8 is greater than or equal to 80% to 90%, the laser beam efficiently reaches the sacrificial layer 910.

A first laser beam L1 proceeds in a thickness direction of the base 100s to be irradiated toward the sacrificial layer 910, the first functional layer 222a, the second functional layer 222c, the second electrode 223, and the capping layer 230, which are stacked. The second electrode 223 is lifted off from the first functional layer 222a and the second functional layer 222c by the first laser beam L1.

In detail, the first laser beam L1 is irradiated onto a second surface 910b of the sacrificial layer 910 facing the base 100s. At the same time, the first laser beam L1 passes through the plurality of slits 920 formed in the sacrificial layer 910. At that time, the first laser beam L1 is irradiated onto one surface of the second electrode 223 via the first functional layer 222a and the second functional layer 222c.

The energy density of the first laser beam L1 has less influence on the sacrificial layer 910 and has an intensity capable of lifting off the second electrode 223. For example, the sacrificial layer 910 may have a structure in which ITO/Ag/ITO are stacked. The second electrode 223 includes a metal material including Ag. The energy density of the first laser beam L1 for selectively lifting off the second electrode 223 may be about 0.7 J/cm$^2$ or less.

Because the first laser beam L1 is infrared light, the first functional layer 222a and the second functional layer 222c including an organic material are not affected, and the first laser beam L1 may be directly irradiated onto the one surface of the second electrode 223. The second electrode 223 absorbs the first laser beam L1. The second electrode 223 is thermally expanded, and the second electrode 223 is lifted off from the first functional layer 222a and the second functional layer 222c. The capping layer 230 on the second electrode 223 may also be lifted off together with the second electrode 223. As such, the second electrode 223 may be removed in advance before removing the sacrificial layer 910.

Next, referring to FIG. 11B, a second laser beam L2 proceeds in the thickness direction of the base 100s to be irradiated toward the sacrificial layer 910, the first functional layer 222a, and the second functional layer 222c, which are stacked. The irradiated second laser beam L2 lifts the sacrificial layer 910 off from the base 100s.

In detail, the second laser beam L2 is irradiated onto the second surface 910b of the sacrificial layer 910 facing the base 100s. The energy density of the second laser beam L2 is relatively greater than the energy density of the first laser beam L1 and has an intensity capable of lifting off the sacrificial layer 910. For example, the energy density of the second laser beam L2 may be about 1.5 J/cm$^2$ or more.

When the second laser beam L2 is irradiated to the sacrificial layer 910, the sacrificial layer 910 absorbs the second laser beam L2. The sacrificial layer 910 is thermally expanded, and the second surface 910b of the sacrificial layer 910 to which a laser beam is irradiated is lifted off from the base 100s. As the sacrificial layer 910 is lifted off, the first functional layer 222a and the second functional layer 222c on the sacrificial layer 910 may be also lifted off together with the sacrificial layer 910.

Because the second electrode 223 is lifted off in advance, when the sacrificial layer 910 is thermally expanded, the sacrificial layer 910, the first functional layer 222a, and the second functional layer 222c may be lifted off without disturbance of the first functional layer 222a and the second functional layer 222c. Accordingly, it is possible to prevent scattering of foreign substances that may occur during a LLO operation in advance.

Subsequently, referring to FIG. 11C, the sacrificial layer pattern 930 may be patterned on the base 100s. When laser processing the sacrificial layer area SLA in which the sacrificial layer 910 is formed, an area to which a laser beam is not irradiated is generated around the start point Ls where the irradiation of a laser beam starts or around the finish point Lf where the irradiation of a laser beam is finished. The sacrificial layer pattern 930 may correspond to a portion of the sacrificial layer 910 remaining in the sacrificial layer area SLA when the sacrificial layer 910 is removed.

In detail, the laser beam may be irradiated from an area adjacent to the dam 240 of FIG. 8 to the opening area OA while rotating in a spiral shape. Due to the characteristics of a laser operation, an area of which the sacrificial layer 910 is not processed exists around the start point Ls where the irradiation of a laser beam starts or around the finish point Lf where the irradiation of a laser beam is finished. A portion of the sacrificial layer 910 remains in the area of which the sacrificial layer 910 is not processed, so that the portion of the sacrificial layer remains as the sacrificial layer pattern 930.

The first sacrificial layer pattern 931 may be patterned around the start point Ls where the irradiation of a laser beam starts. The vicinity of the start point Ls where the irradiation of a laser beam starts may be the sacrificial layer area SLA adjacent to the dam 240 of FIG. 8. The second sacrificial layer pattern 932 may be patterned around the finish point Lf where the irradiation of a laser beam is finished. The vicinity of the finish point Lf where the irradiation of a laser beam is finished may be the sacrificial layer area SLA adjacent to the opening area OA of FIG. 8.

The first sacrificial layer pattern 931 and the second sacrificial layer pattern 932 may be respectively patterned in a linear pattern or a curved pattern around the start point Ls where the irradiation of a laser beam starts and around the finish point Lf where the irradiation of a laser beam is finished. The first sacrificial layer pattern 931 and the second sacrificial layer pattern 932 may be a discontinuous pattern or a continuous pattern. Substantially, the first sacrificial layer pattern 931 and the second sacrificial layer pattern 932 may be a portion of a sacrificial layer 1010, 1020, 1030 and 1040 shown in FIGS. 10A to 10D.

Figure 9C:
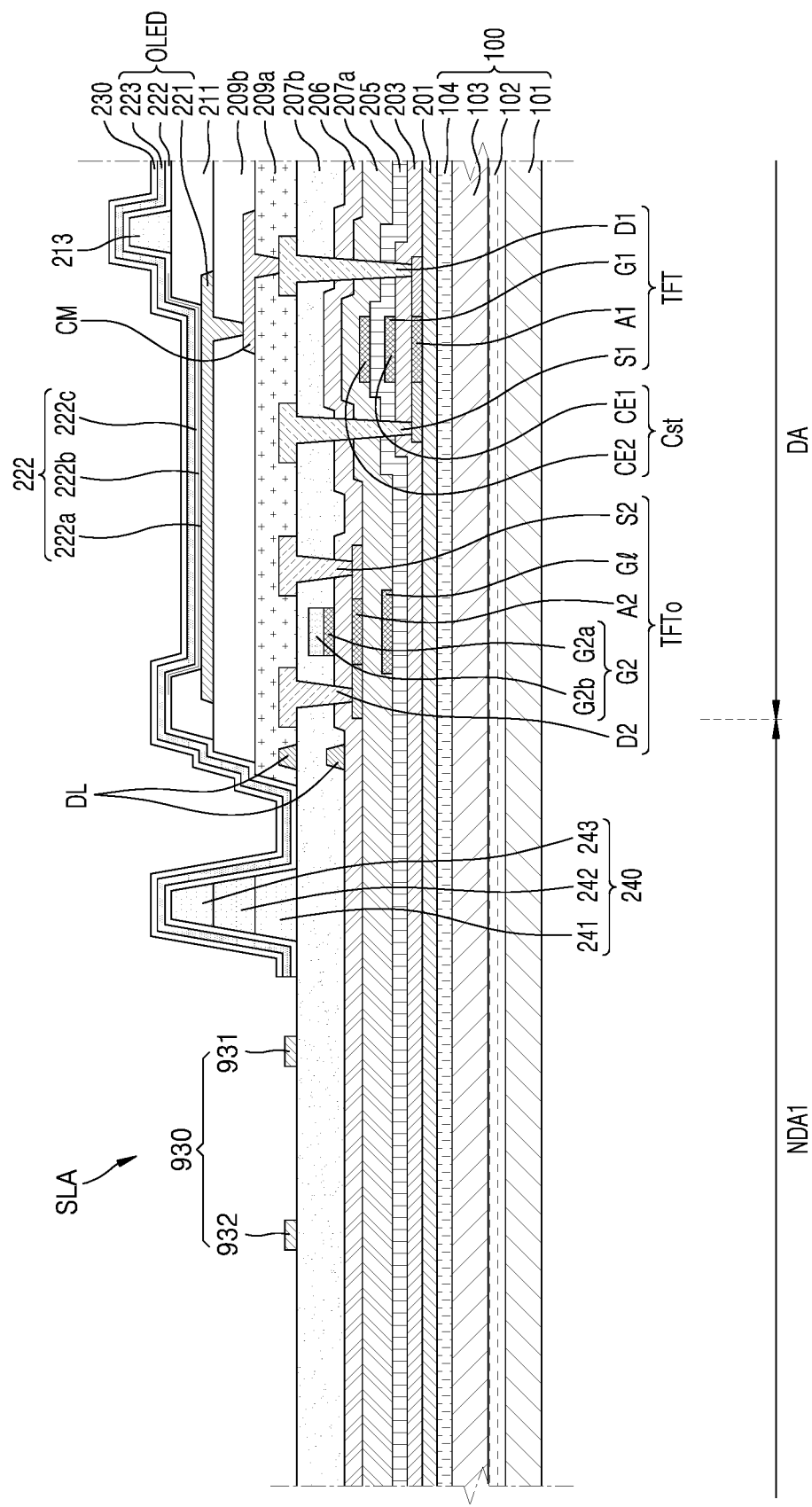

Referring to FIG. 9C, when the sacrificial layer 910 is lifted off from the substrate 100, the first sacrificial layer pattern 931 and the second sacrificial layer pattern 932, which are a portion of the sacrificial layer 910, remain in the sacrificial layer area SLA. On the other hand, a remaining portion of the sacrificial layer 910 except the first sacrificial layer pattern 931 and the second sacrificial layer pattern 932, the first functional layer 222a, the second functional layer 222c, the second electrode 223, and the capping layer 230 do not exist in the sacrificial layer area SLA.

Figure 9D:
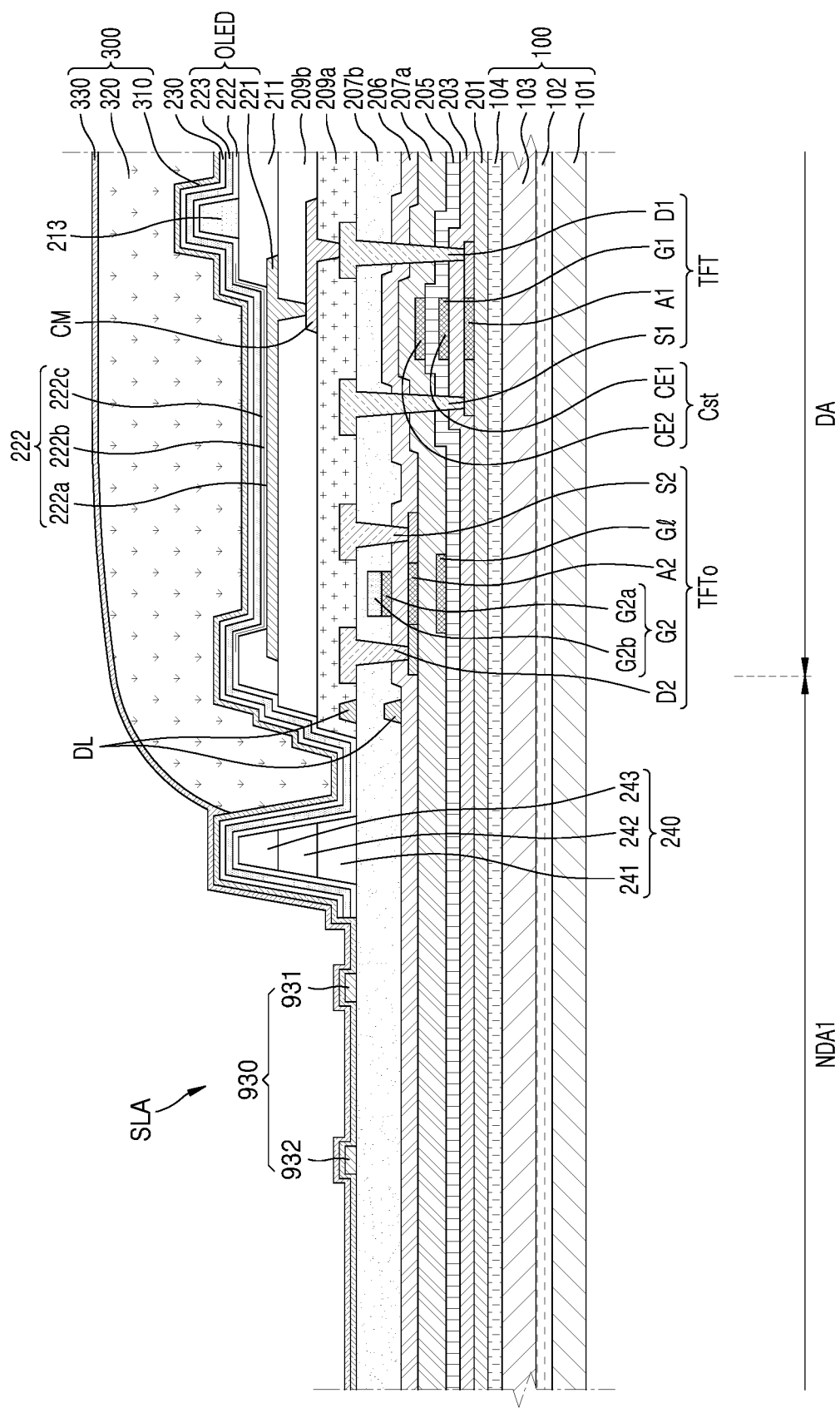

Next, referring to FIG. 9D, the encapsulation layer 300 is formed above the substrate 100. The first inorganic encapsulation layer 310 and the second inorganic encapsulation layer 330 are formed on substantially the entire surface of the substrate 100. The first inorganic encapsulation layer 310 extends from the display area DA to the sacrificial layer area SLA via the dam 240. In the sacrificial layer area SLA, the first inorganic encapsulation layer 310 covers the first sacrificial layer pattern 931 and the second sacrificial layer pattern 932 remaining on the second interlayer insulating layer 207b, and the second interlayer insulating layer 207b.

The organic encapsulation layer 320 is formed on the first inorganic encapsulation layer 310. An end portion of the organic encapsulation layer 320 is located on the side portion of the dam 240 facing the display area DA. The dam 240 may control the flow of the organic encapsulation layer 320.

The second inorganic encapsulation layer 330 is formed on the organic encapsulation layer 320. As the first inorganic encapsulation layer 310, the second inorganic encapsulation layer 330 extends from the display area DA to the sacrificial layer area SLA via the dam 240. In the sacrificial layer area SLA, the second inorganic encapsulation layer 330 is in a direct contact with the first inorganic encapsulation layer 310.

Figure 9E:
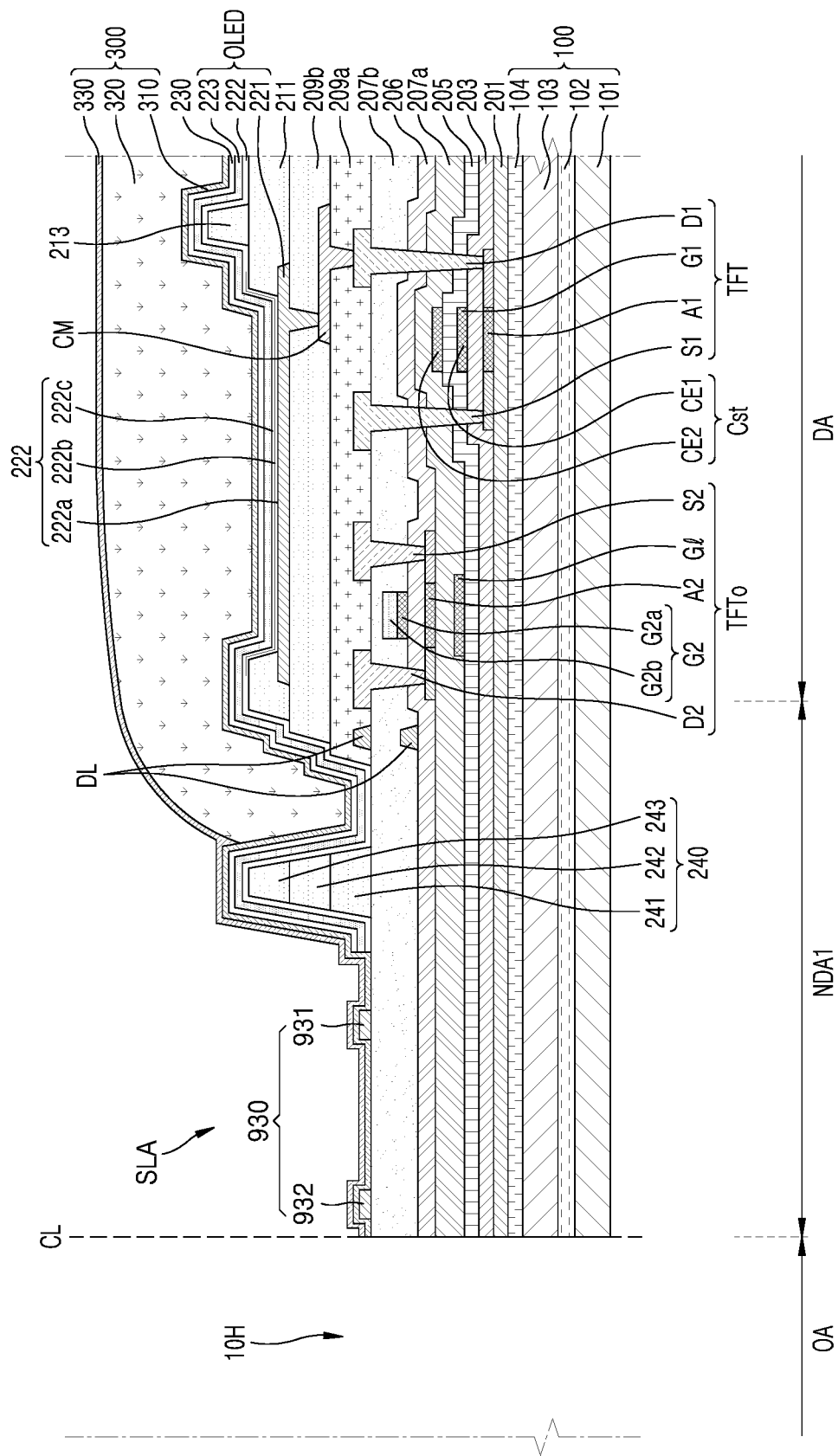

Referring to FIG. 9E, the first opening 10H is formed by cutting the substrate 100 and the insulating layers 201 to 330 stacked on the substrate 100 along a cutting line CL. Because the first functional layer 222a, the second functional layer 222c, and the capping layer 230, which include an organic material, are not exposed on a sidewall of the first opening 10H, moisture is prevented from penetrating into the organic light-emitting diode OLED through the first opening 10H.

In display panels constructed according to the principles and embodiments of the invention and illustrative methods of manufacturing the same, particles that may be generated during the process of removing a sacrificial layer, an intermediate layer, and a second electrode, which are stacked in a non-display area between an opening area and a display area, by a LLO method may be easily controlled to avoid generating significant accumulation of harmful particles.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel comprising:
   a substrate having an opening and a display area surrounding the opening;
   a light-emitting element in the display area and including a first electrode, an intermediate layer, and a second electrode;
   a multi-layered dam in a non-display area between the opening and the display area;
   an encapsulation layer extending substantially over the display area and the non-display area; and
   a first layer pattern disposed in one area of the non-display area and having a bottom surface coplanar with a corresponding bottom surface of the multi-layered dam.

2. The display panel of claim 1, wherein the first layer pattern is disposed in at least one of the non-display area adjacent to the multi-layered dam or the non-display area adjacent to the opening.

3. The display panel of claim 1, wherein the first layer pattern is arranged in the one area of the non-display area in a discontinuous linear pattern or a discontinuous curved pattern.

4. The display panel of claim 1, wherein the first layer pattern is arranged in the one area of the non-display area in a continuous linear pattern or a continuous curved pattern.

5. The display panel of claim 1, wherein the first layer pattern comprises a sacrificial layer pattern having the same material as that of the first electrode.

6. The display panel of claim 1, wherein at least one inorganic encapsulation layer in the encapsulation layer covers the first layer pattern.

7. The display panel of claim 1, wherein the opening extends completely through the substrate.

8. The display panel of claim 1, wherein the multi-layered dam comprises:
   an insulating layer on the substrate;
   a first organic insulating layer directly contacting the insulating layer; and
   a second organic insulating layer directly contacting the first organic insulating layer.

9. The display panel of claim 8, wherein
   the intermediate layer overlaps the multi-layered dam and directly contacts the insulating layer, the first organic insulating layer, and the second organic insulating layer.

10. The display panel of claim 1, wherein the intermediate layer overlaps and directly contacts the multi-layered dam.

11. The display panel of claim 1, wherein
    the bottom surface of the multi-layered dam extends between and ends at first and second side surfaces of the multi-layered dam.

12. The display panel of claim 11, wherein the bottom surface of the first layer pattern and the bottom surface of the multi-layered dam directly contact an upper surface of a second interlayer insulating layer.

13. The display panel of claim 1, wherein
    the first layer pattern is spaced apart from the multi-layered dam in a horizontal direction by the intermediate layer overlapping the multi-layered dam in a thickness direction.

14. The display panel of claim 13, wherein
    the first layer pattern is spaced apart from the multi-layered dam in the horizontal direction by an inorganic encapsulation layer overlapping the multi-layered dam, the first layer pattern, and the intermediate layer in a thickness direction.

15. The display panel of claim 1, wherein the encapsulation layer directly contacts an upper surface of the first layer pattern, and the encapsulation layer is an inorganic encapsulation layer.

* * * * *